(12) United States Patent
Yun et al.

(10) Patent No.: US 10,665,569 B2
(45) Date of Patent: May 26, 2020

(54) VERTICAL TRANSISTOR DEVICE AND METHOD FOR FABRICATING THE SAME

(71) Applicant: TAIWAN SEMICONDUCTOR MANUFACTURING CO., LTD., Hsinchu (TW)

(72) Inventors: Wei-Sheng Yun, Taipei (TW); Shao-Ming Yu, Hsinchu County (TW); Chih-Chieh Yeh, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/795,191

(22) Filed: Oct. 26, 2017

(65) Prior Publication Data

US 2018/0342480 A1 Nov. 29, 2018

Related U.S. Application Data

(60) Provisional application No. 62/510,752, filed on May 25, 2017.

(51) Int. Cl.
| | |
|---|---|
| *H01L 25/04* | (2014.01) |
| *H01L 21/70* | (2006.01) |
| *H01L 21/027* | (2006.01) |
| *H01L 29/66* | (2006.01) |
| *H01L 29/78* | (2006.01) |
| *H01L 29/08* | (2006.01) |

(52) U.S. Cl.
CPC .......... *H01L 25/043* (2013.01); *H01L 21/027* (2013.01); *H01L 21/70* (2013.01); *H01L 29/0847* (2013.01); *H01L 29/66666* (2013.01); *H01L 29/7827* (2013.01); *H01L 2924/13067* (2013.01)

(58) Field of Classification Search
CPC . H01L 51/56; H01L 51/5072; H01L 51/5056; H01L 33/62; C09K 11/06
USPC .......................................................... 257/288
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |

(Continued)

*Primary Examiner* — Andy Huynh
(74) *Attorney, Agent, or Firm* — McClure, Qualey & Rodack, LLP

(57) ABSTRACT

A vertical transistor device and its fabrication method are provided. The vertical transistor device includes a semiconductor substrate, first sources/drains and second sources/drains. The semiconductor substrate includes a bottom portion and a fin portion. The fin portion is located on the bottom portion. The fin portion includes an upper portion and a lower portion located between the bottom portion of the semiconductor substrate and the upper portion. The lower portion includes a narrow portion having a width smaller than a width of the upper portion, and the narrow portion contacts an interface portion of the upper portion. The sources/drains are disposed on the on the narrow portion of the lower portion of the fin portion. In the method for fabricating the vertical transistor device, the lower portions of the fin portions are patterned to form the narrow portions where the sources are disposed.

20 Claims, 24 Drawing Sheets

(56) References Cited

U.S. PATENT DOCUMENTS

| | | | |
|---|---|---|---|
| 9,431,399 B1* | 8/2016 | Alptekin | H01L 27/0924 |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,647,112 B1* | 5/2017 | Balakrishnan | H01L 29/7845 |
| 9,812,575 B1* | 11/2017 | Reznicek | H01L 29/165 |
| 9,899,515 B1* | 2/2018 | Cheng | H01L 29/7827 |
| 2007/0231997 A1* | 10/2007 | Doyle | H01L 29/66818 438/253 |
| 2015/0371892 A1* | 12/2015 | Xie | H01L 21/76224 257/401 |
| 2017/0236917 A1* | 8/2017 | Nowak | H01L 29/66545 257/401 |

* cited by examiner

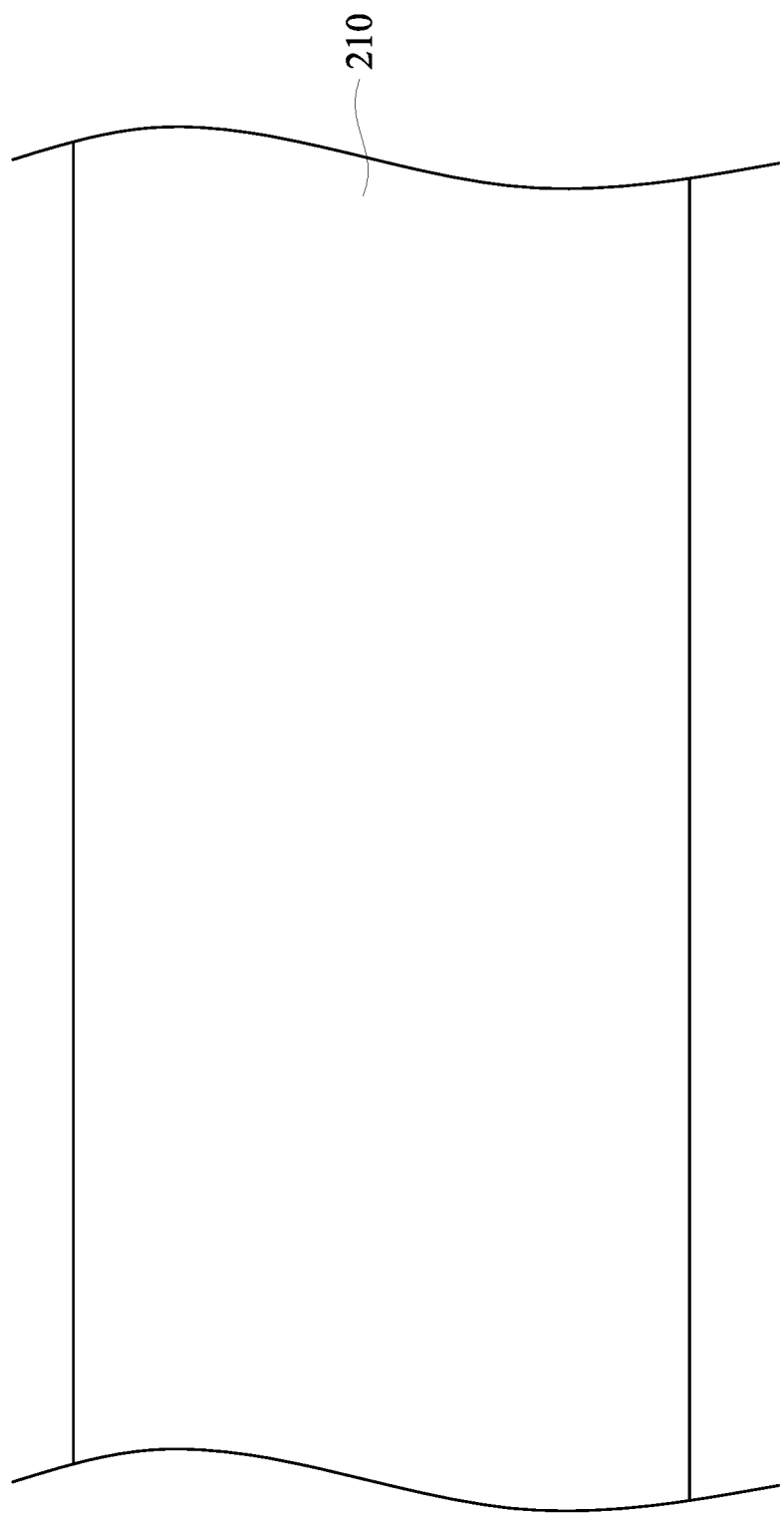

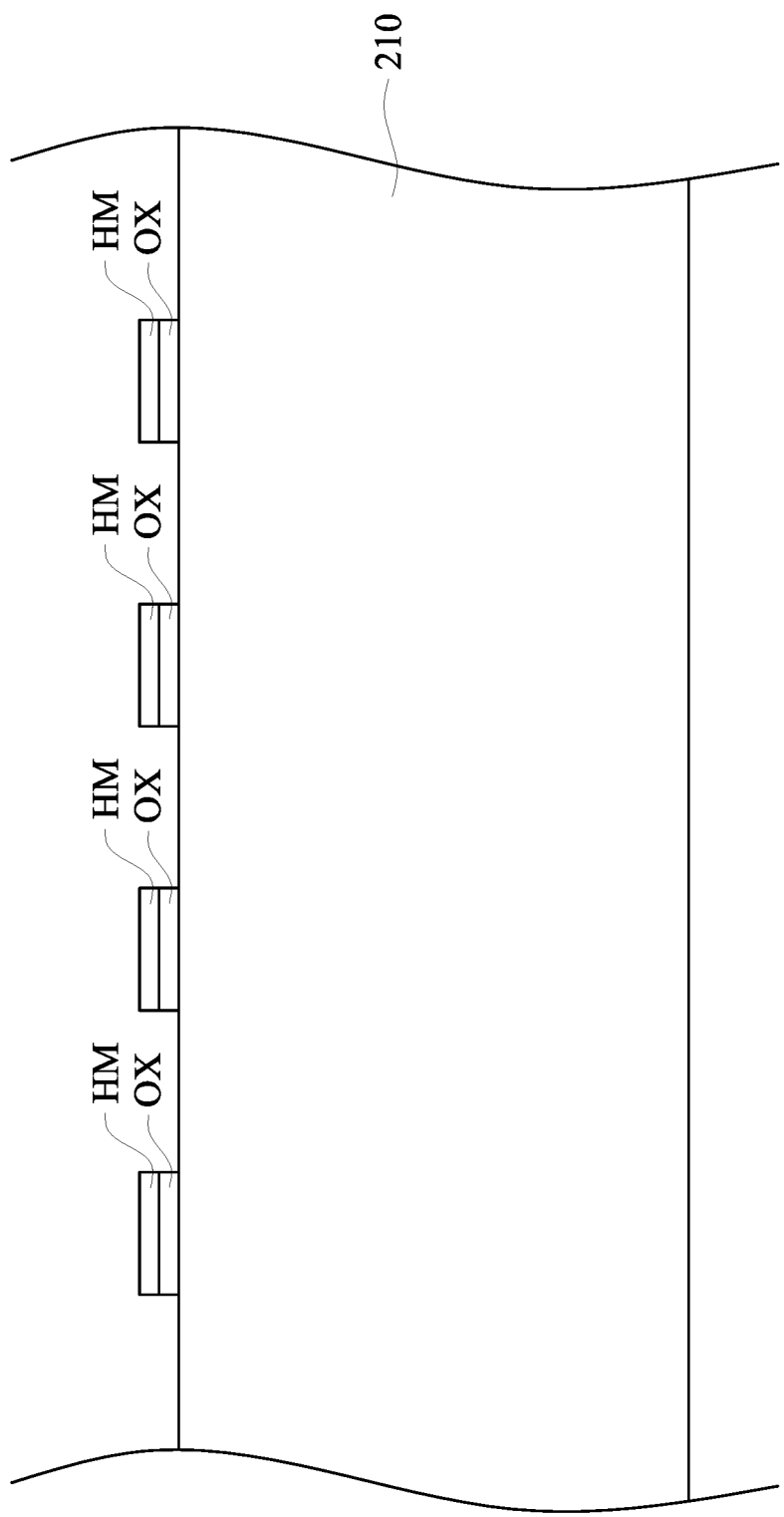

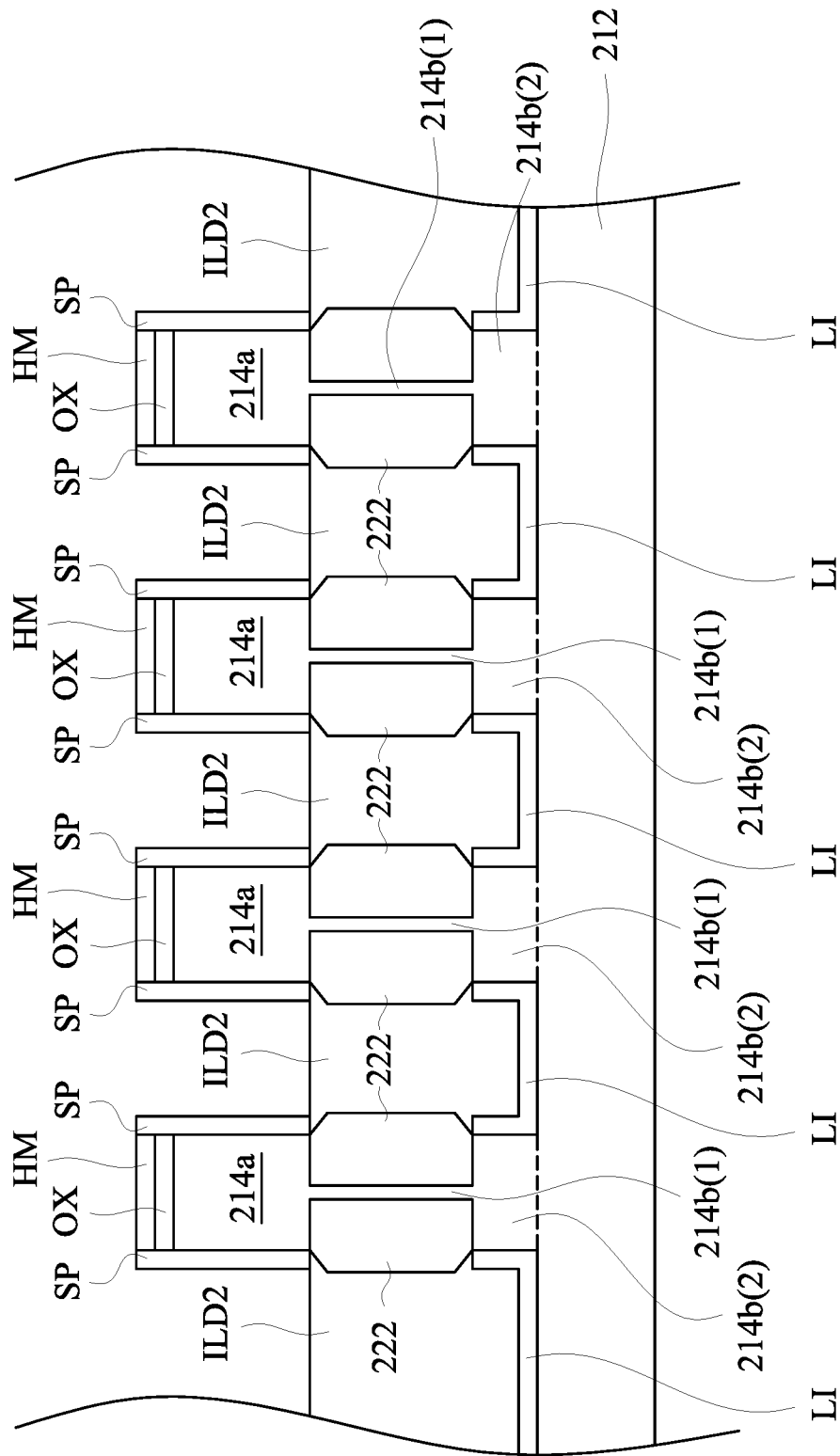

VERTICAL TRANSISTOR DEVICE AND METHOD FOR FABRICATING THE SAME

RELATED APPLICATION

This application claims the benefit of the Provisional Application Ser. No. 62/510,752, filed May 25, 2017. The entire disclosures of all the above applications are hereby incorporated by reference herein.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

In order to form an integrated circuit device in a small area, vertical transistors are developed. In a typical vertical transistor, a conducting channel is provided by a silicon nanowire which perpendicular to a plane of an underlying semiconductor substrate. The vertical channel is surrounded by a three-dimensional gate structure. The three-dimensional gate structure can be referred to as vertical-gate-all-around (VGAA) configuration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
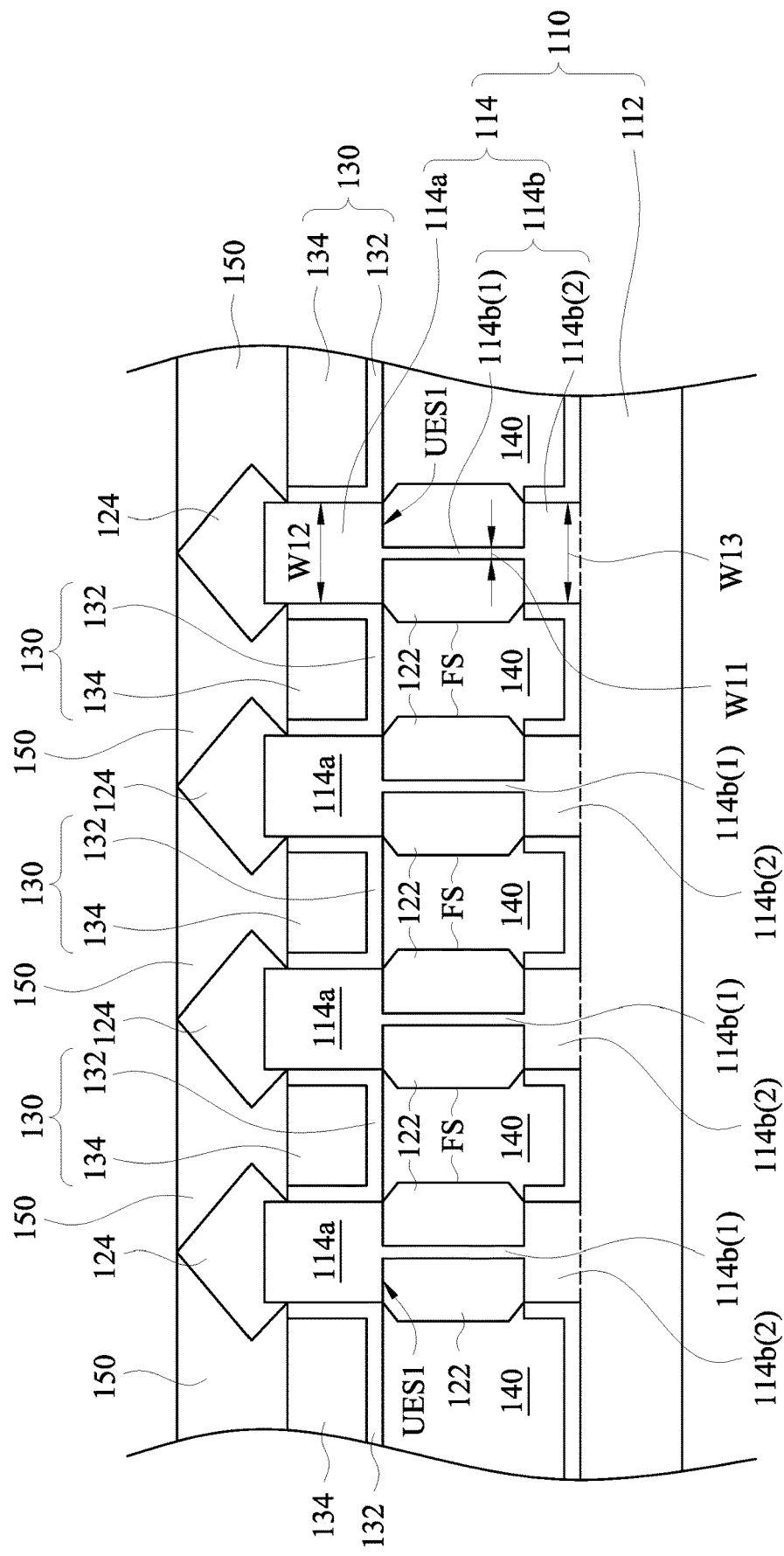
FIG. 1A, FIG. 1B and FIG. 1C are schematic cross-sectional views of transistor devices in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure are directed to a vertical transistor device and a method for fabricating the vertical transistor. The vertical transistor device includes a semiconductor substrate and plural sources/drains. The semiconductor substrate includes a bottom portion and a fin portion located on the bottom portion. The fin portion includes an upper portion and a lower portion. The lower portion includes a narrow portion having a width smaller than a width of the upper portion, and the narrow portion contacts an interface portion of the upper portion. The sources/drains are disposed on the narrow portion of the lower portion of the fin portion, and each of the sources/drains has an edge portion contacting the interface portion of the upper portion of the fin portion, thereby increasing a contact area between the sources/drains and the upper portion of the fin portion, in which a gate structure is predetermined to be disposed on the upper portion of the fin portion to induce a channel in the upper portion of the fin portion. Therefore, a contact area between the sources/drains and the channel is increased, and a distance between the sources/drains and the channel is decreased accordingly.

Referring to FIG. 1A, FIG. 1A is a schematic cross-sectional view of a transistor device 100 in accordance with some embodiments of the present disclosure. The transistor device 100 includes a semiconductor substrate 110, plural sources 122 and drains 124, plural gate structures 130 and plural dielectric layers 140 and 150.

The semiconductor substrate 110 includes a bottom portion 112 and plural fin portions 114. In some embodiments, the semiconductor substrate 110 may be a semiconductor material and may include structures including a graded layer or a buried oxide, for example. In some exemplary examples, the semiconductor substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 110. Alternatively, the semiconductor substrate 110 may be an active layer of a semiconductor-on-insulator (SOI) substrate or a multi-layered structure such as a silicon-germanium layer formed on a bulk silicon layer.

The fin portions 114 are disposed on the bottom portion 112. Each of the fin portions 114 includes an upper portion 114a and a lower portion 114b. The lower portions 114b are located between the bottom portion 112 of the semiconductor substrate 110 and the upper portions 114a. Each of the lower portions 114b includes a narrow portion 114b(1) and a base portion 114b(2) located between the narrow portion 114b(1) and the bottom portion 112 of the semiconductor substrate 110. In some embodiments, a width W11 of the narrow portion 114b(1) is smaller than a width W12 of the upper portion 114a. In some embodiments, a width W13 of the base portion 114b(2) is equal to the width W12 of the upper portion 114a.

The sources 122 are formed on the narrow portion 114b(1). In some embodiments, the sources 122 are formed by using an epitaxial growth process. Because the width W11 of the narrow portion 114b(1) is smaller than the width W12 of the upper portion 114a, the sources 122 can be formed on the exposed surfaces UES1 of the upper portions 114a, and thus an edge portion of each of the source 122 contacts the exposed surfaces UES1 of a corresponding upper portion 114a. In some embodiments, edge portions of the sources 122 fully cover the exposed surfaces UES1 of the upper portion 114a.

The gate structures 130 are formed on sidewalls of the upper portions 114a of the fin portions 114 to induce channels in the upper portions 114a of the fin portions. In some embodiments, the fin portions 114 are formed perpendicular to the plane of the bottom portion 112, and thus the induce channels are perpendicular to the plane of the bottom portion 112. Each of the gate structures 130 includes a gate dielectric layer 132 and a gate electrode 134 disposed on the gate dielectric layer 132. In some embodiments, the gate structures 130 are high-k metal gate structures. For example, the gate electrode 134 can be formed by metal, and the gate dielectric layer 132 may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, or another suitable material.

The dielectric layers 140 are disposed between the lower portions 114b of the fin portions 114 to isolate the sources 122 from each other, and to provide support for the gate structures 130. In some embodiments, the dielectric layers 140 can be made by oxide, but embodiments of the present disclosure are not limited thereto.

The drains 124 are disposed on the ends of the upper portions 114a of the fin portions 114. In some embodiments, the drains 124 are formed by using an epitaxial growth process, and the drains 124 are not merged with each other. In some embodiments, the positions of the drains 124 and the sources 122 can be exchanged. For example, the drains 124 can be disposed on the narrow portion 114b(1) of the fin portions 114, and the sources 122 can be disposed on the ends of the upper portions 114a of the fin portions 114.

The dielectric layers 150 are disposed between the drains 124 to isolate the drains 124 from each other. In some embodiments, the dielectric layers 150 can be made by oxide, but embodiments of the present disclosure are not limited thereto.

In some embodiments, silicide layers (not shown) can be formed on the sources 122 for contact landing. For example, the sources 122 disposed on adjacent two of the fin portions 114 have opposite front surfaces FS, and a first silicide layer is formed to cover the front surface FS of one of the sources 122, and a second silicide layer is formed to cover the front surface FS of another one of the sources 122. Then, a first contact is formed on the first silicide layer, and a second contact is formed on the second silicide layer.

It can be understood that, because the width W11 of the narrow portion 114b(1) is smaller than the width W12 of the upper portion 114a, the sources 122 can be formed on the exposed surfaces UES1 of the upper portion 114a, thereby increasing a contact area between the sources 122 and the channel induced in the upper portion 114a, and a distance between the sources 122 and the channel is decreased accordingly.

Figure 1B:
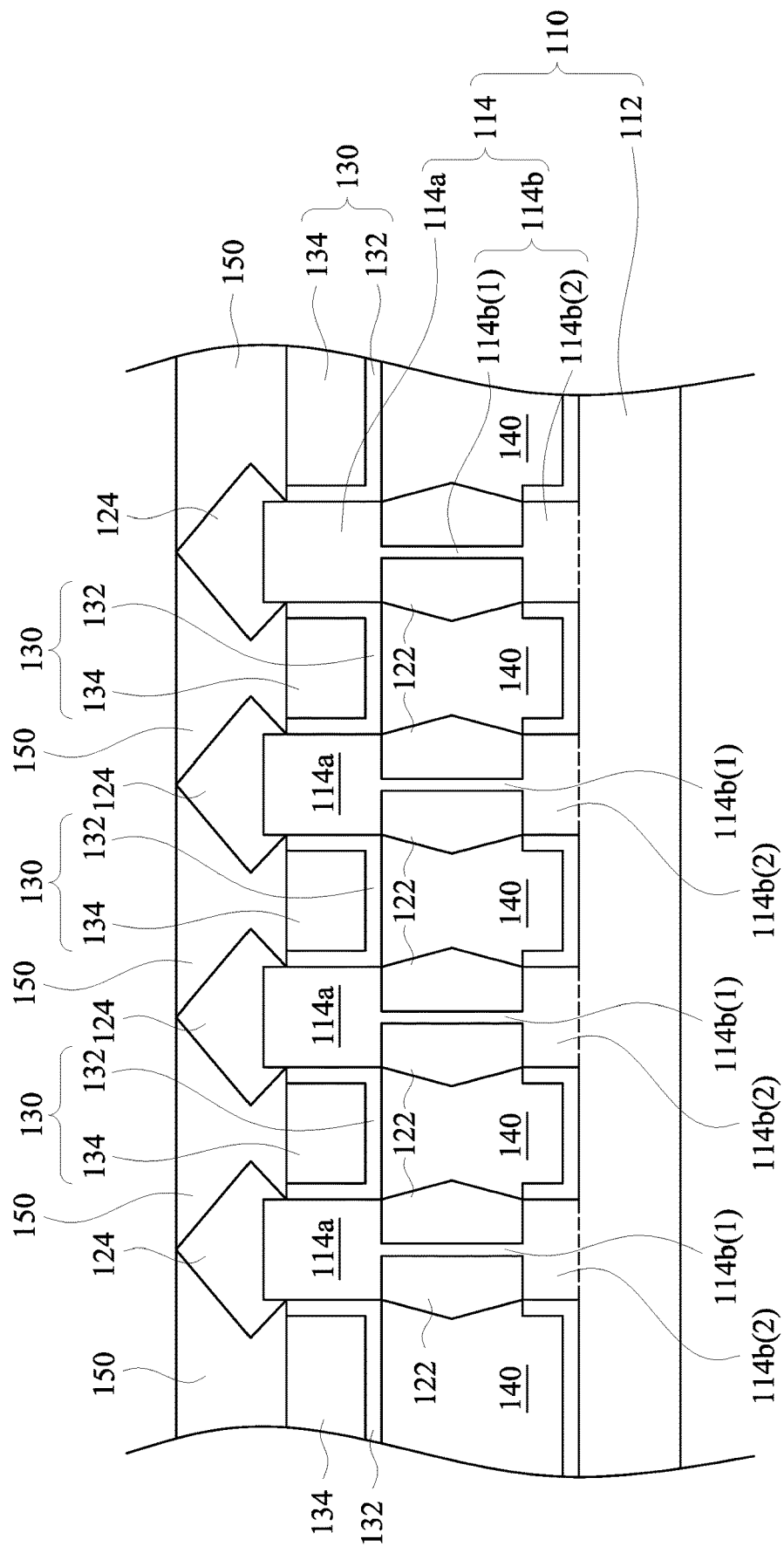
Figure 1C:
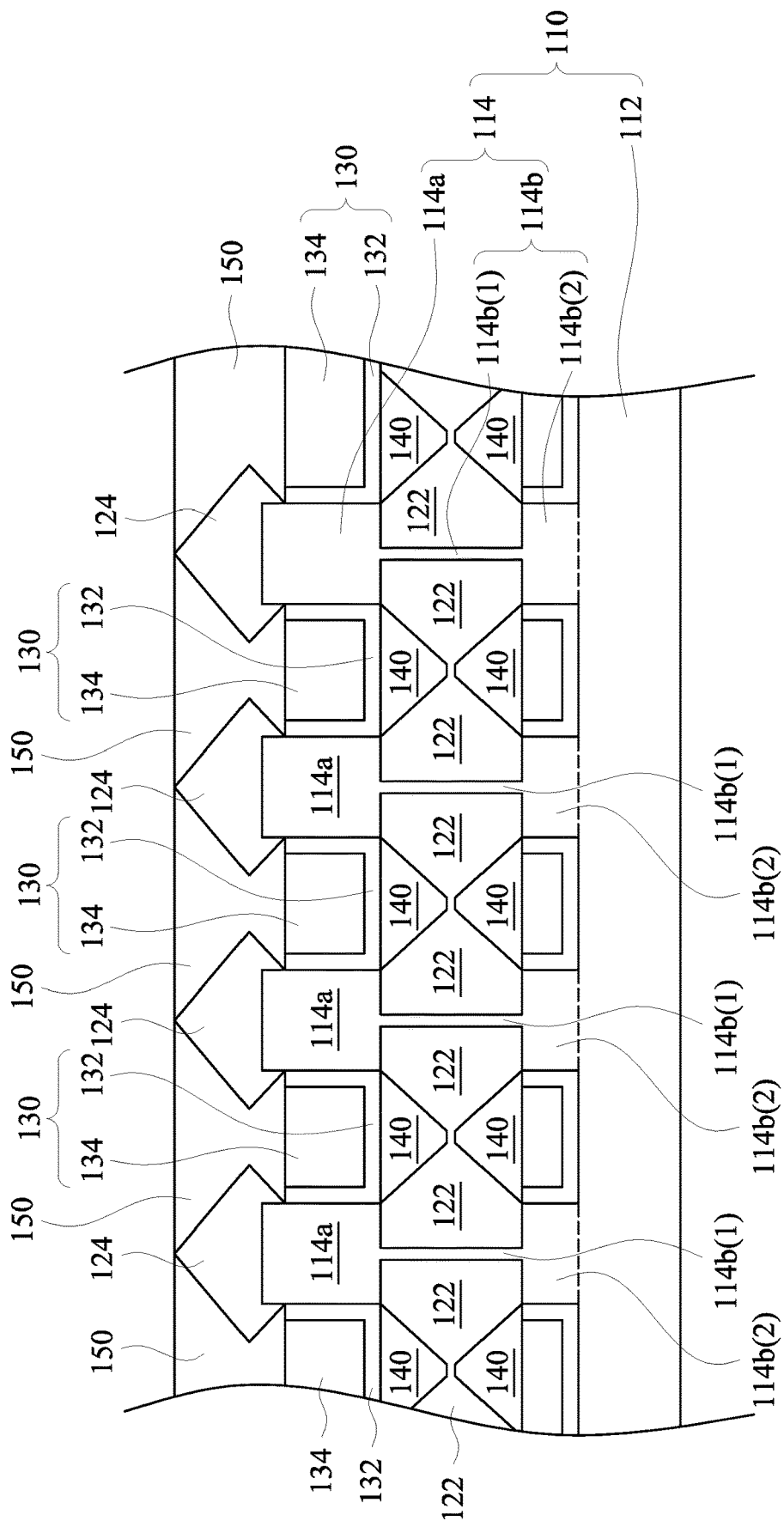

In the above embodiment, each of the sources 122 is formed to have a flat surface FS, but embodiments of the present disclosure are not limited thereto. In some embodiments, the sources 122 are formed to have protrusion portions opposite to each other as shown in FIG. 1B. In some embodiments, adjacent two sources 122 are formed to be merged as shown in FIG. 1C.

Figure 2C:
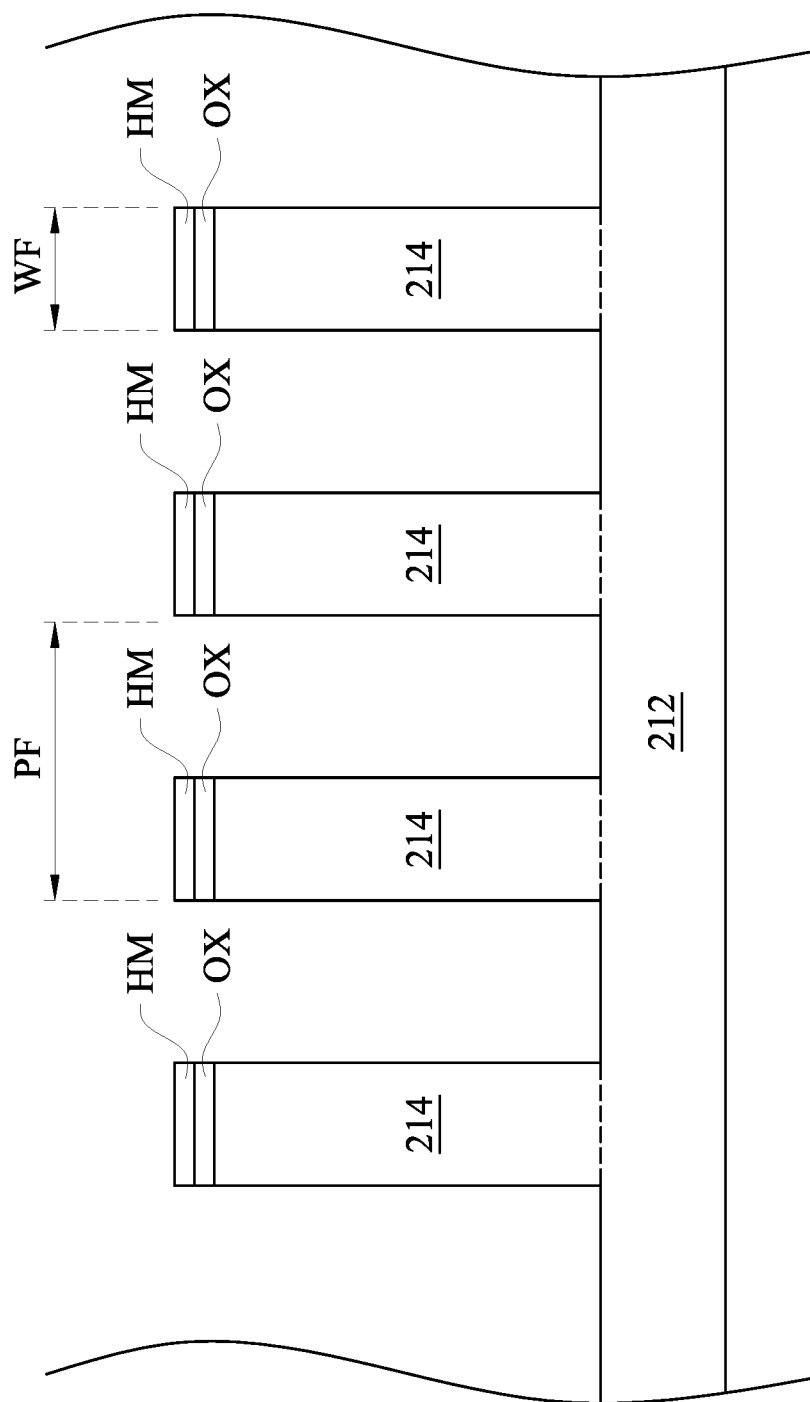
FIG. 2A to FIG. 2T are cross-sectional views of intermediate stages showing a method for fabricating a transistor device in accordance with some embodiments of the present disclosure.
Figure 2D:
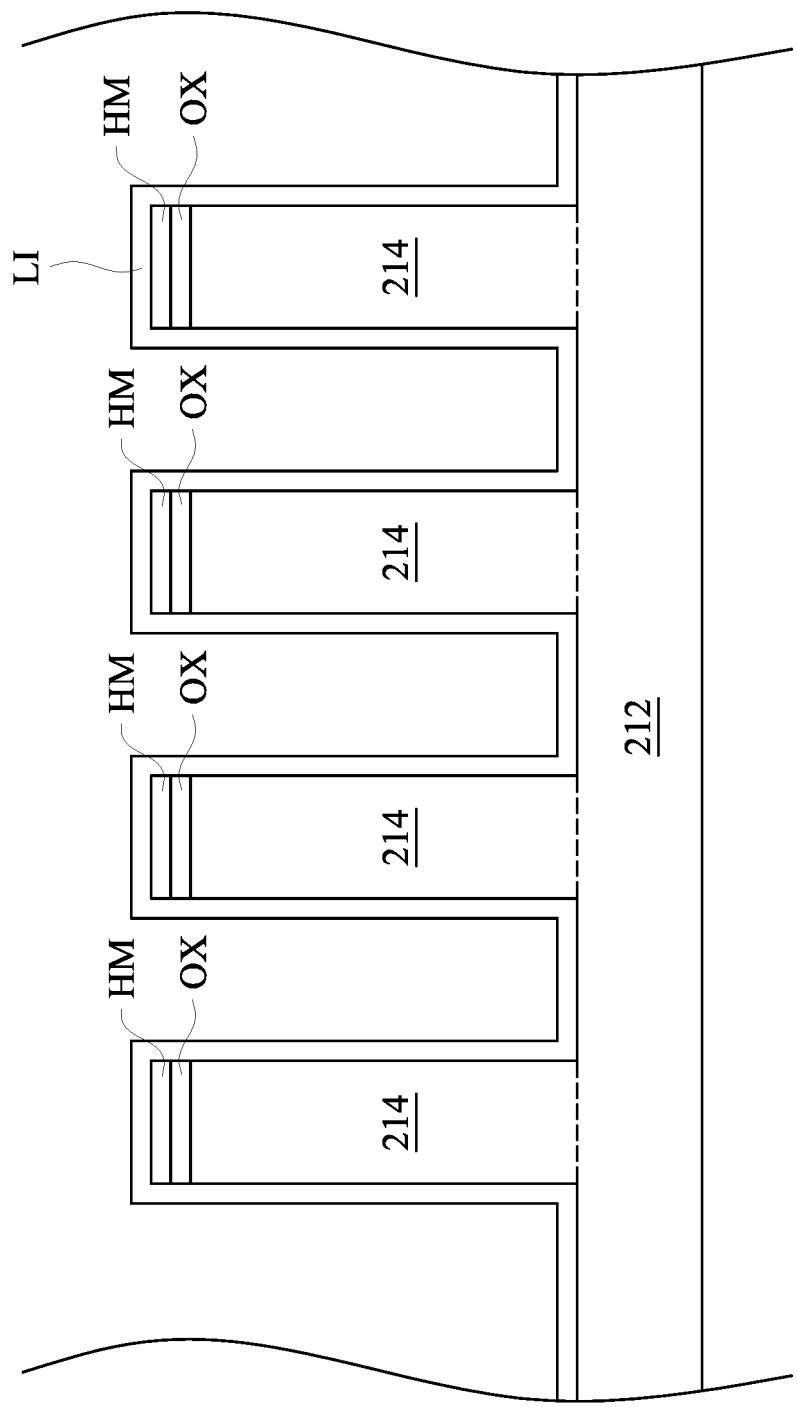
Figure 2E:
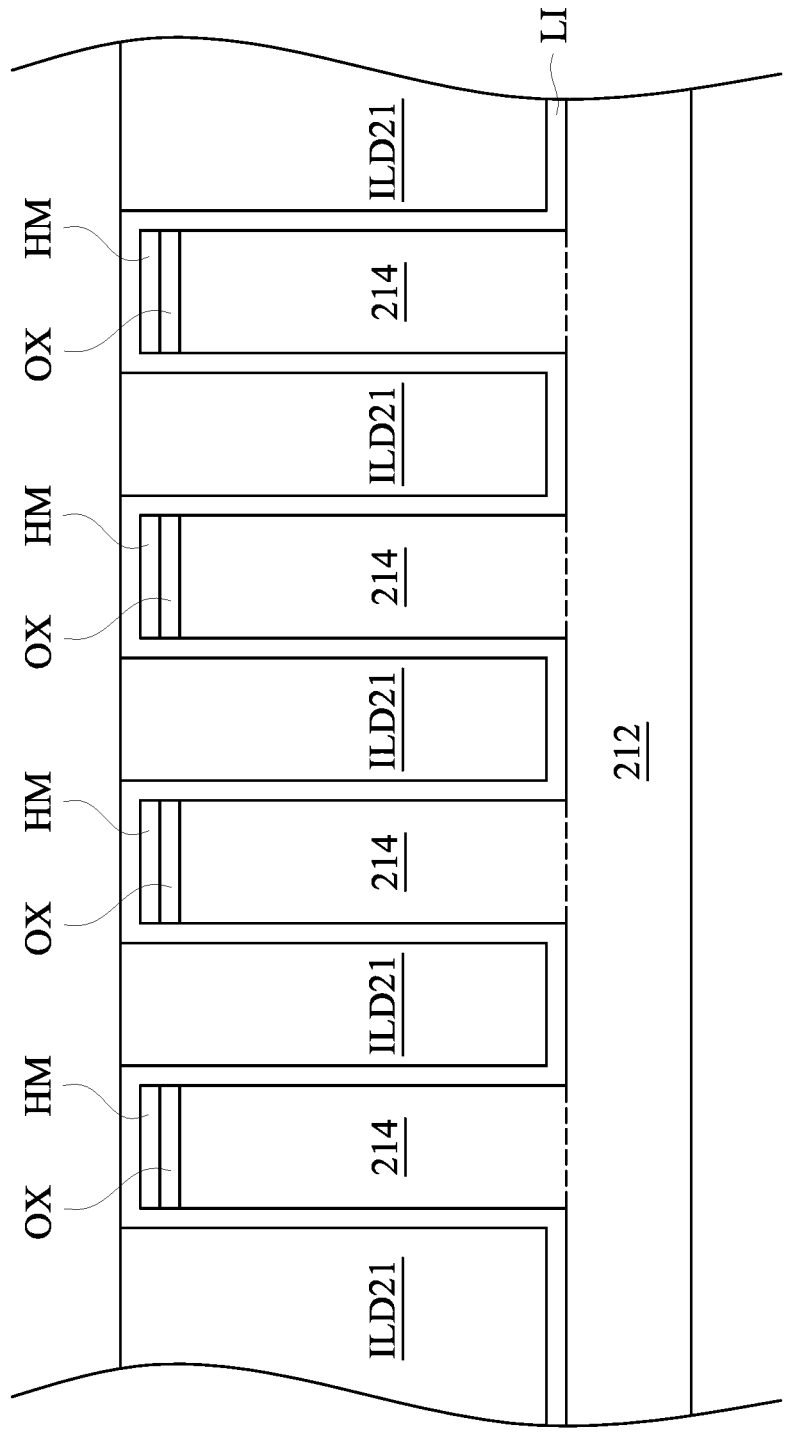
Figure 2F:
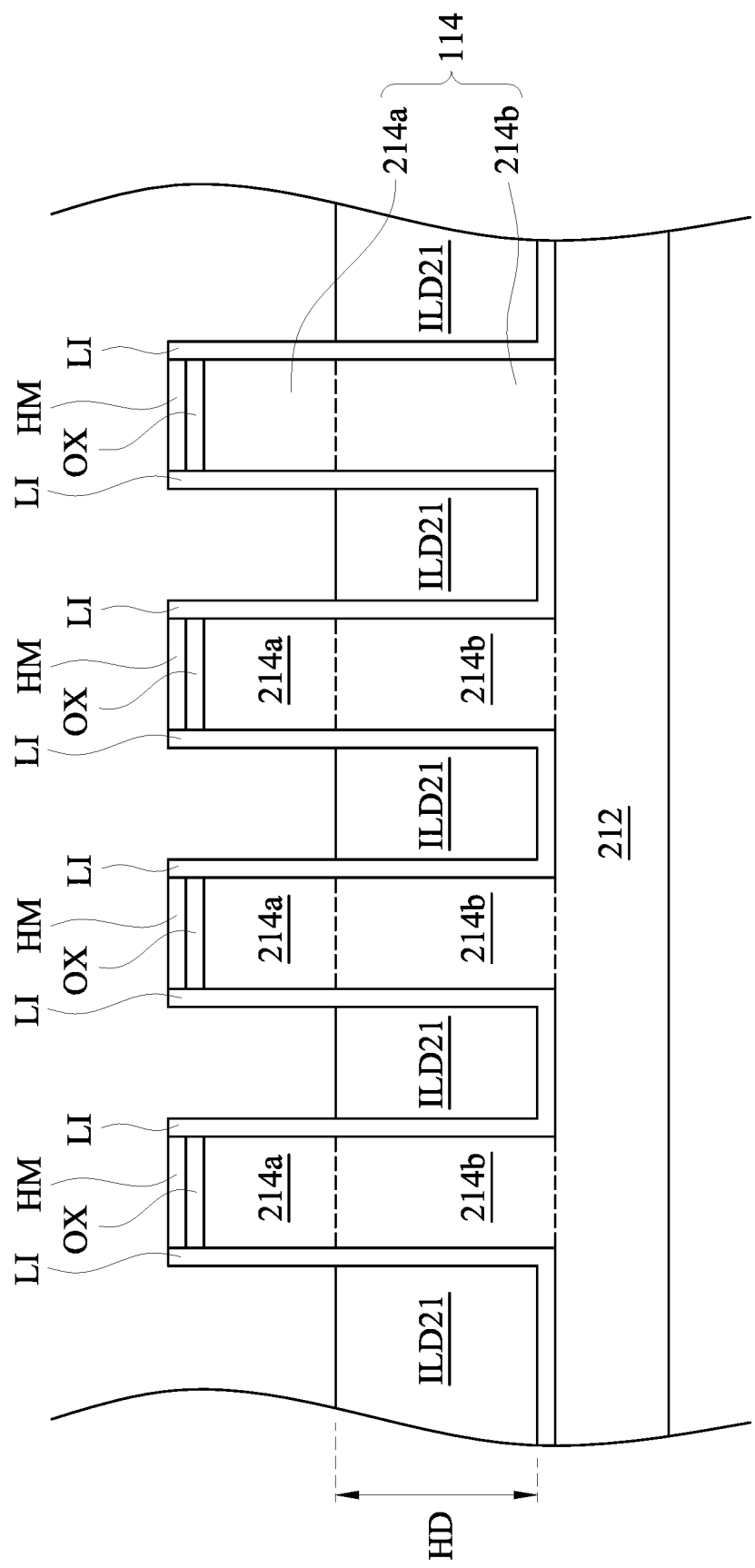
Figure 2G:
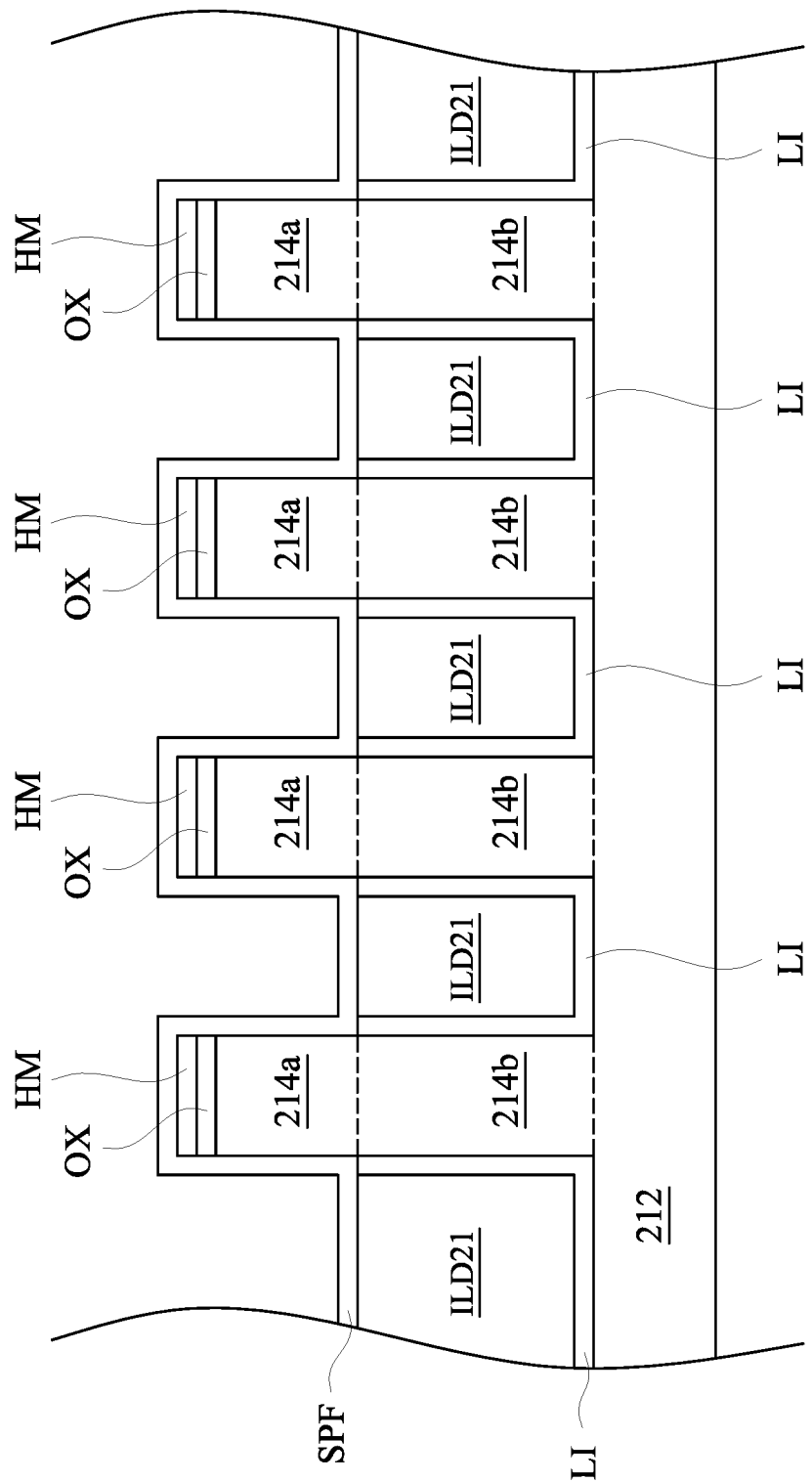
Figure 2H:
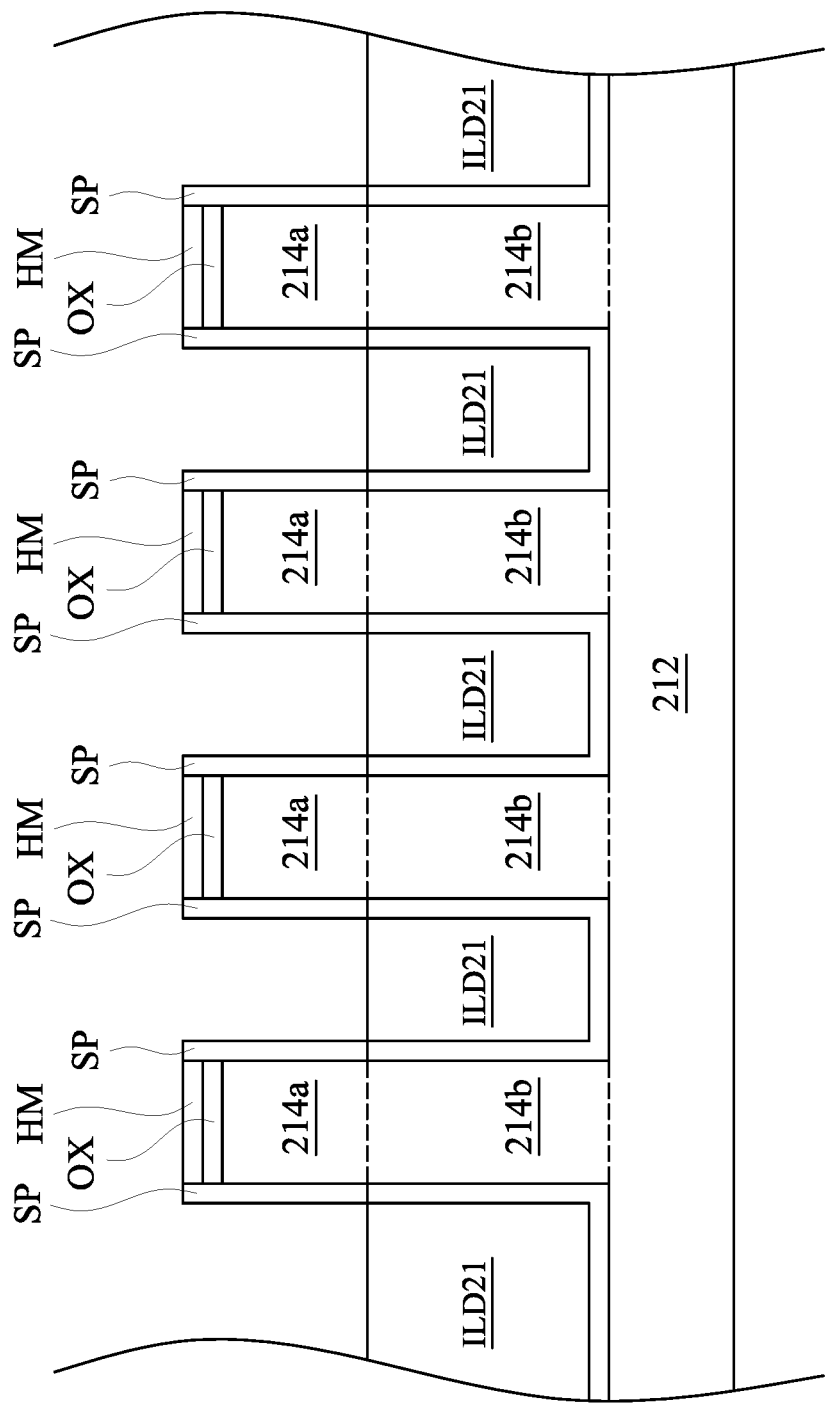
Figure 2I:
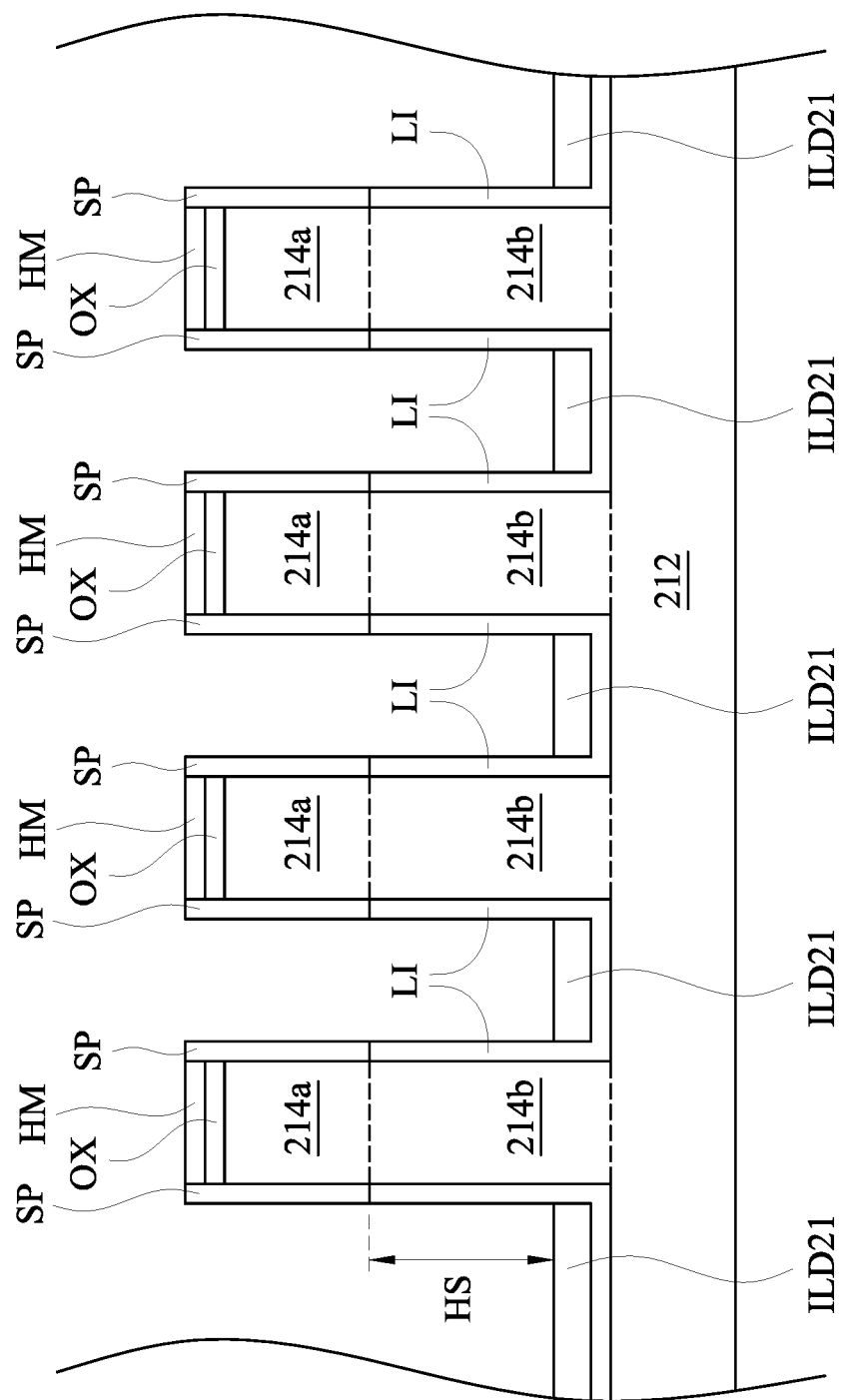
Figure 2J:
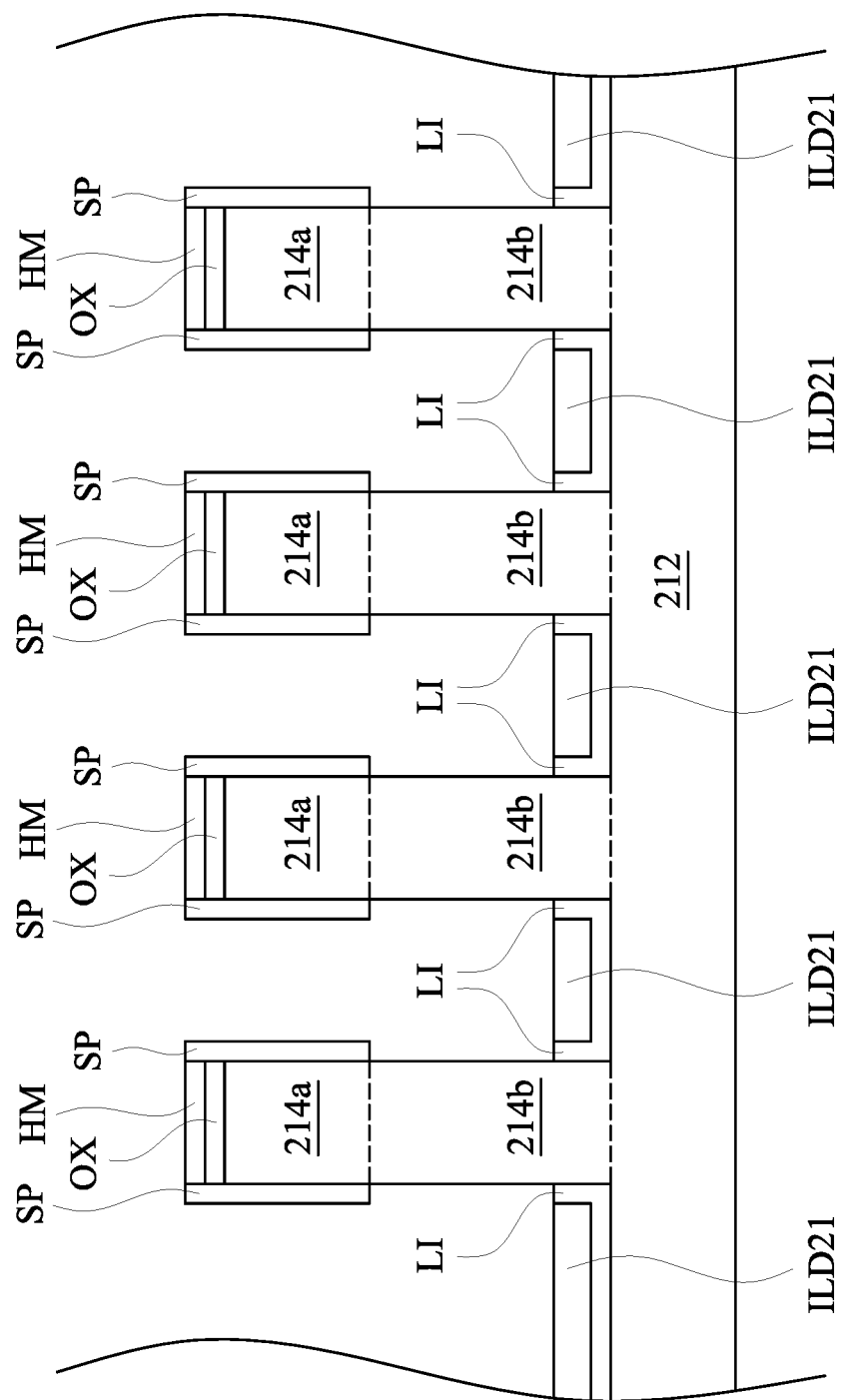
Figure 2K:
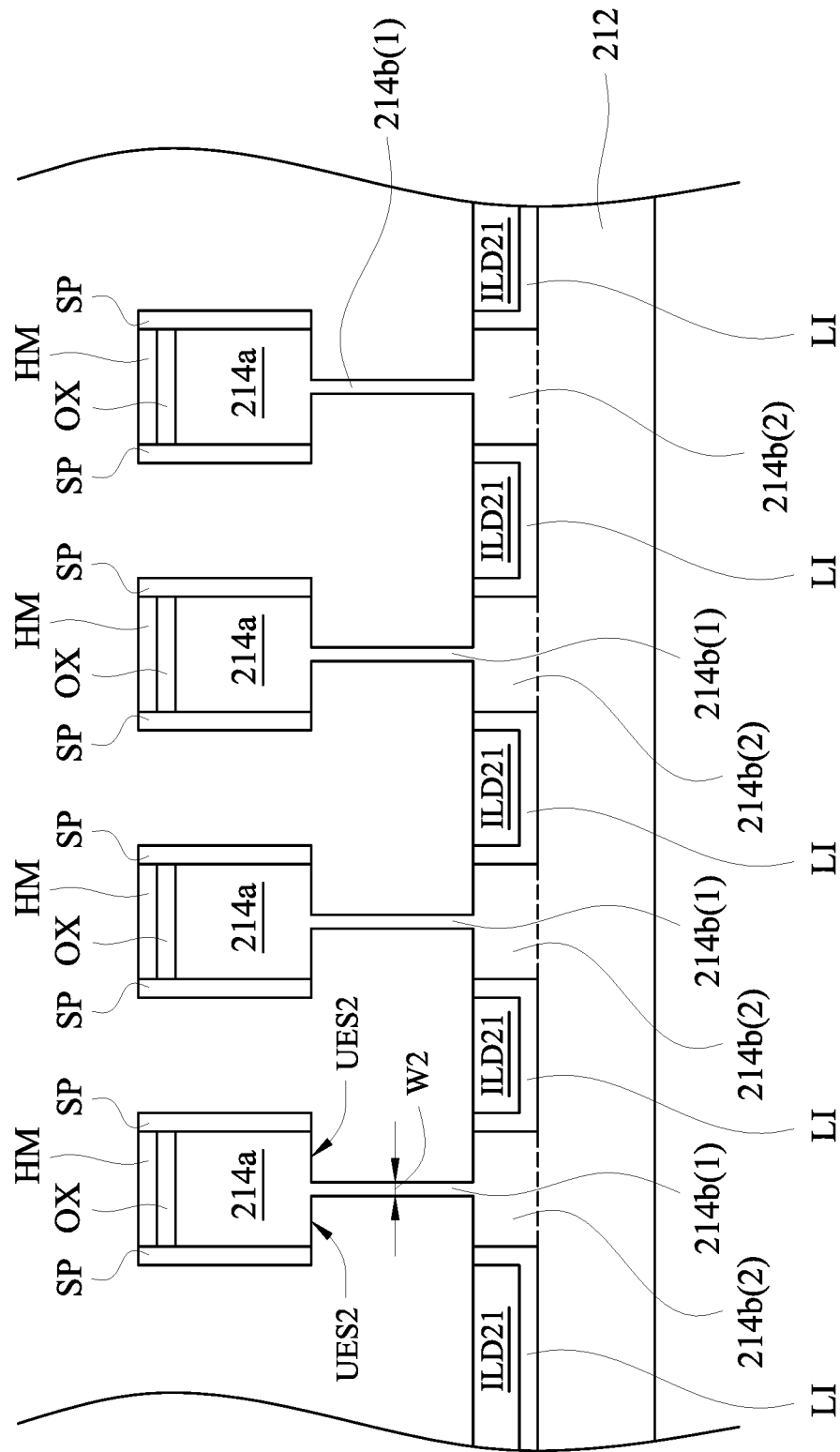
Figure 2L:
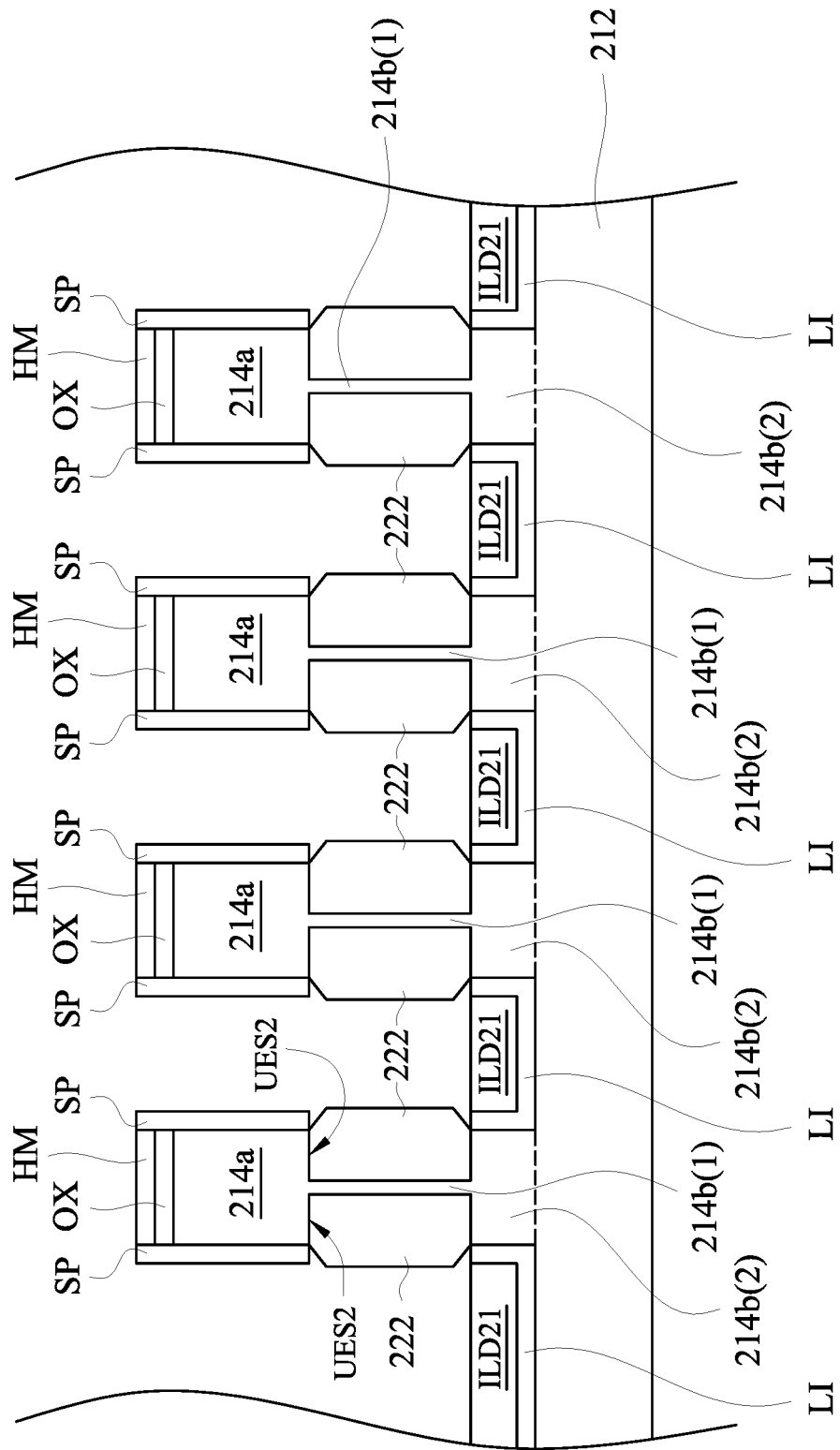
Figure 2M:
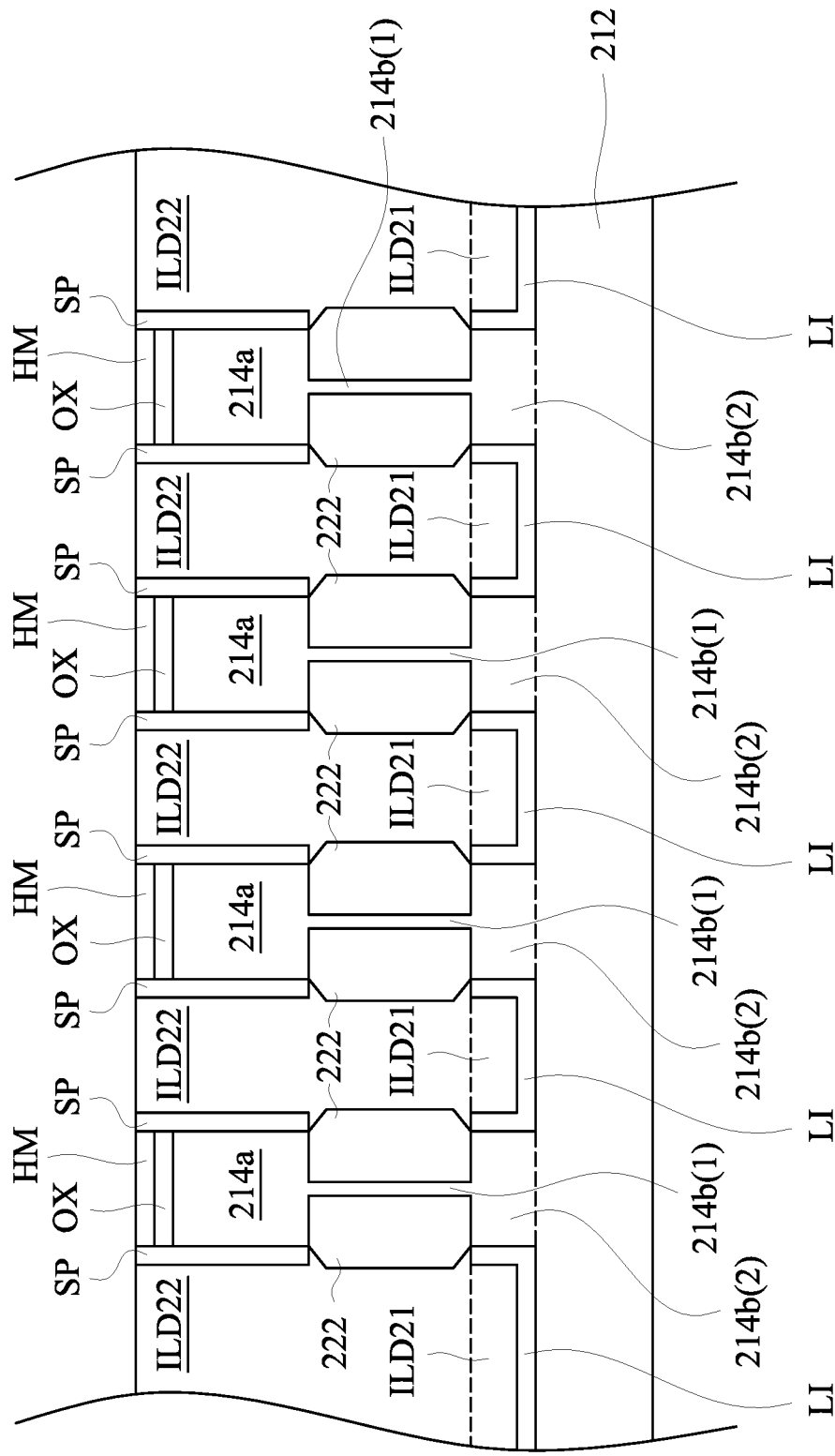
Figure 2O:
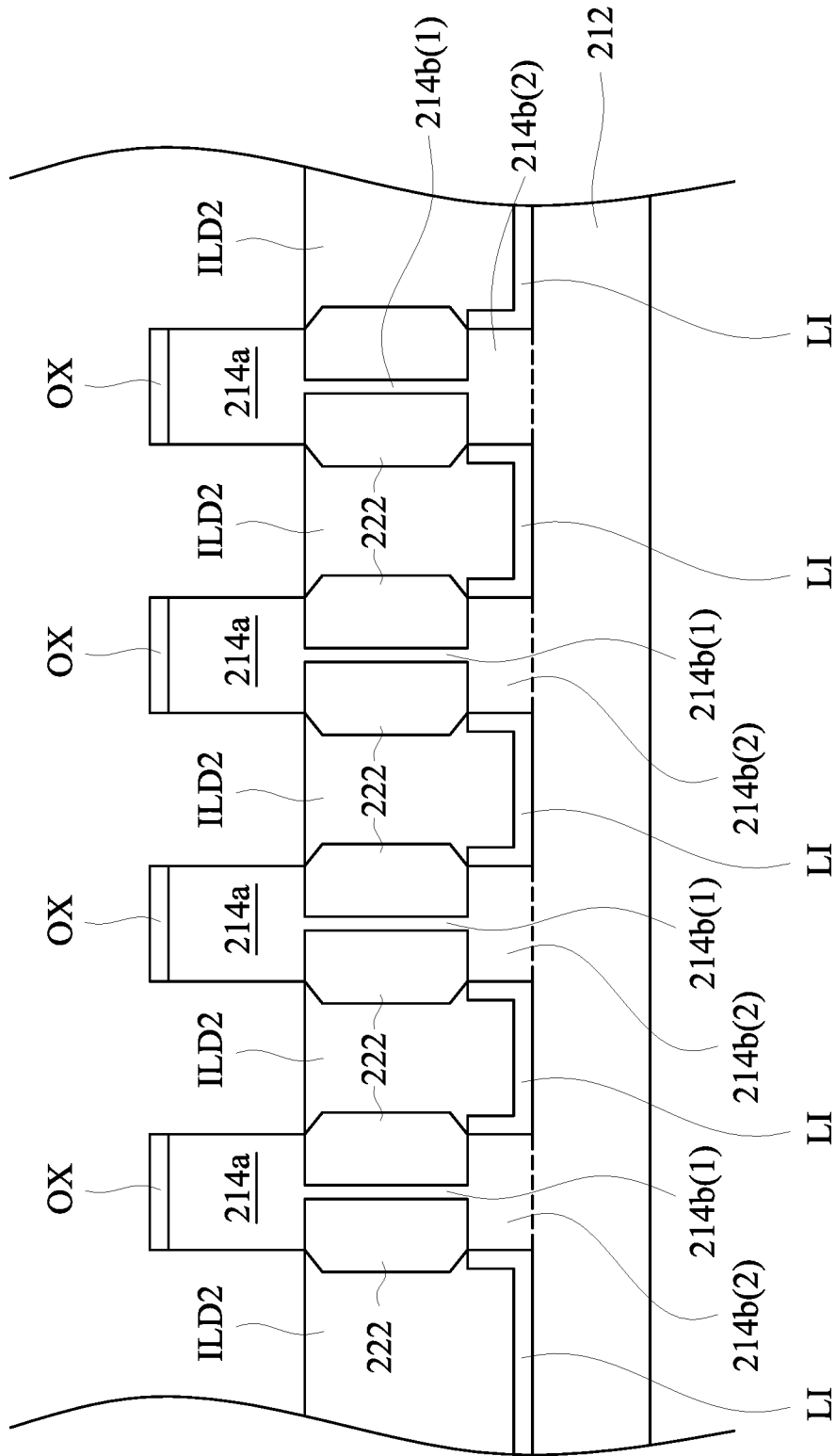
Figure 2P:
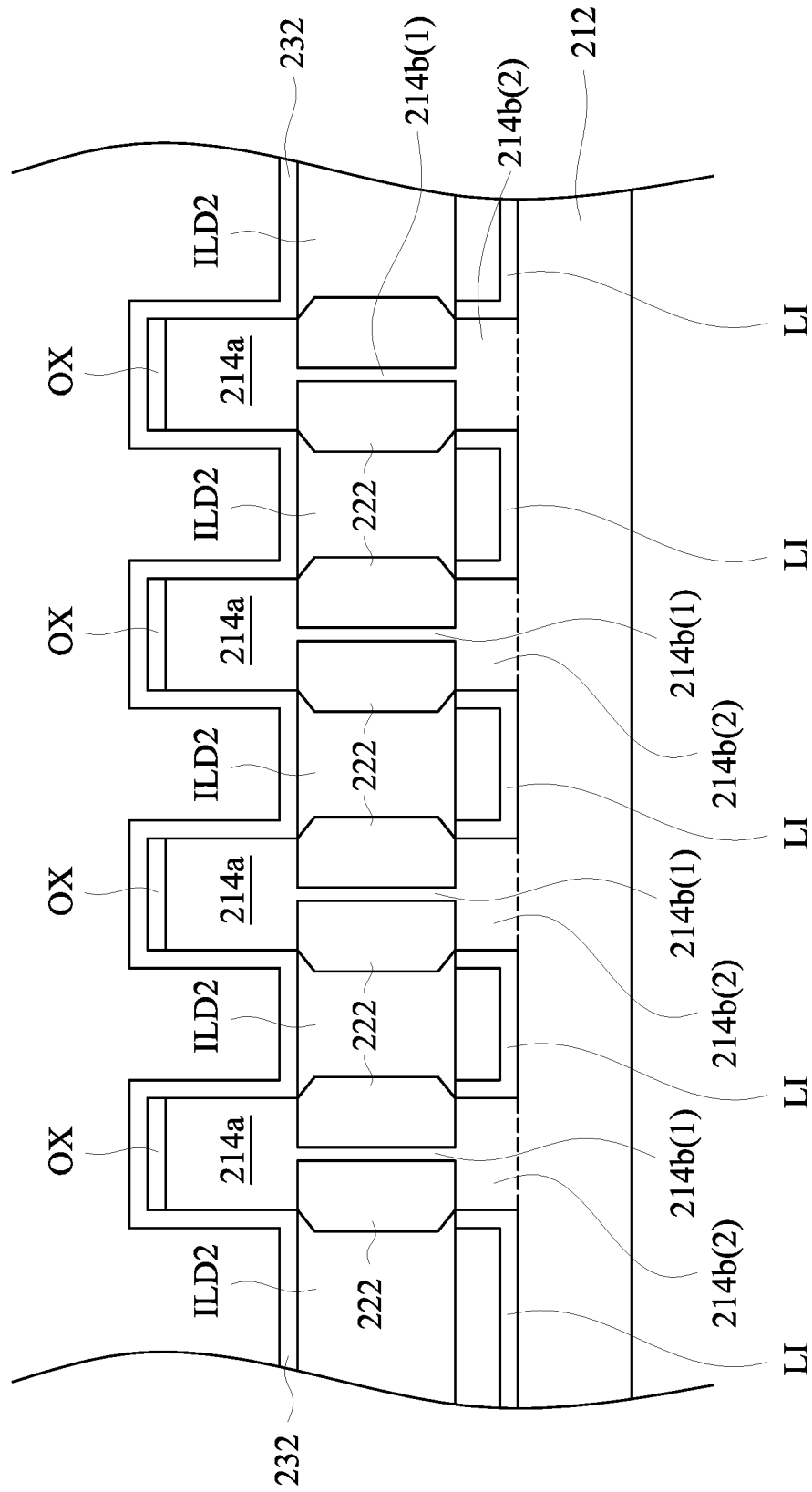
Figure 2Q:
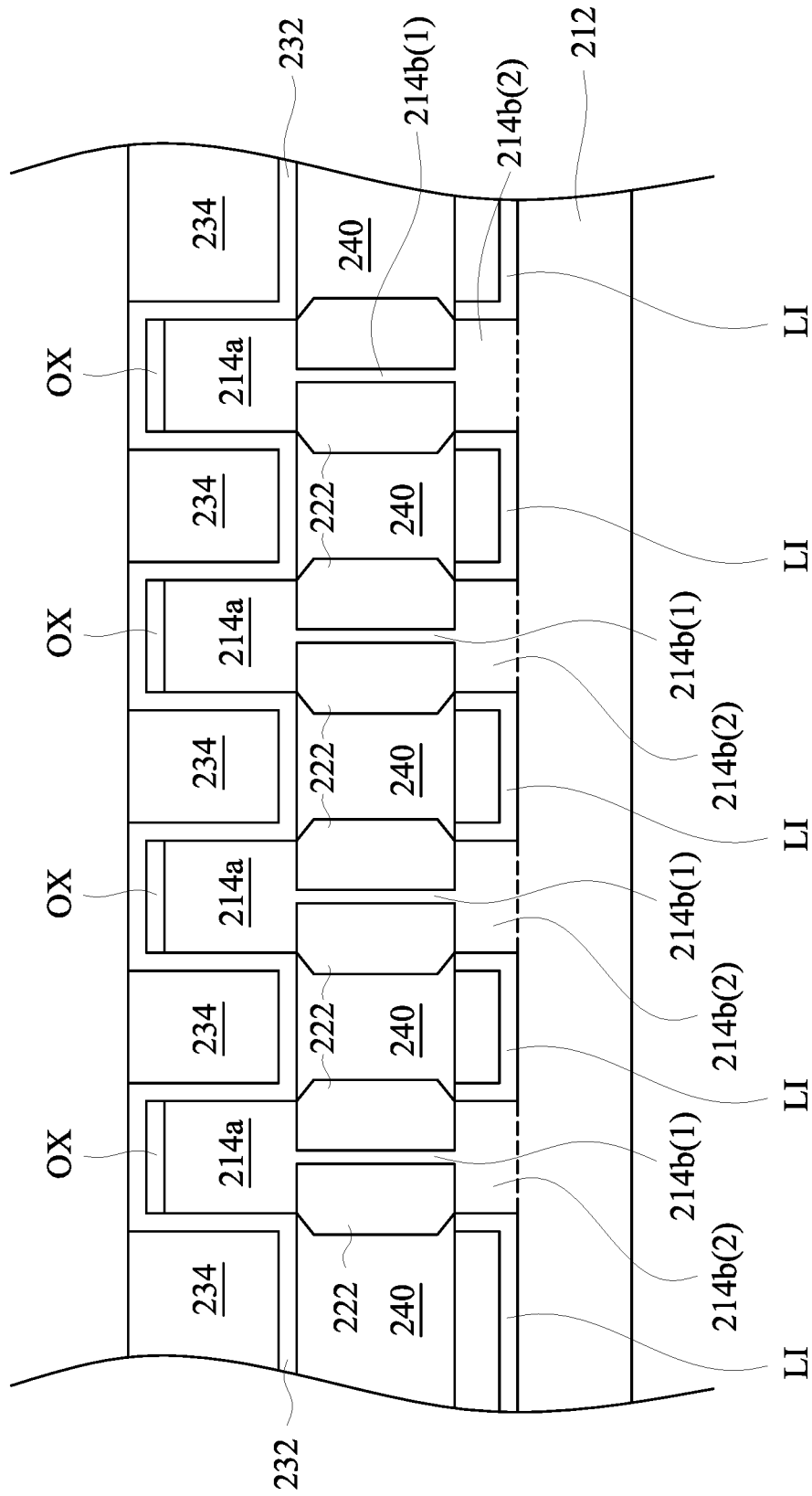
Figure 2R:
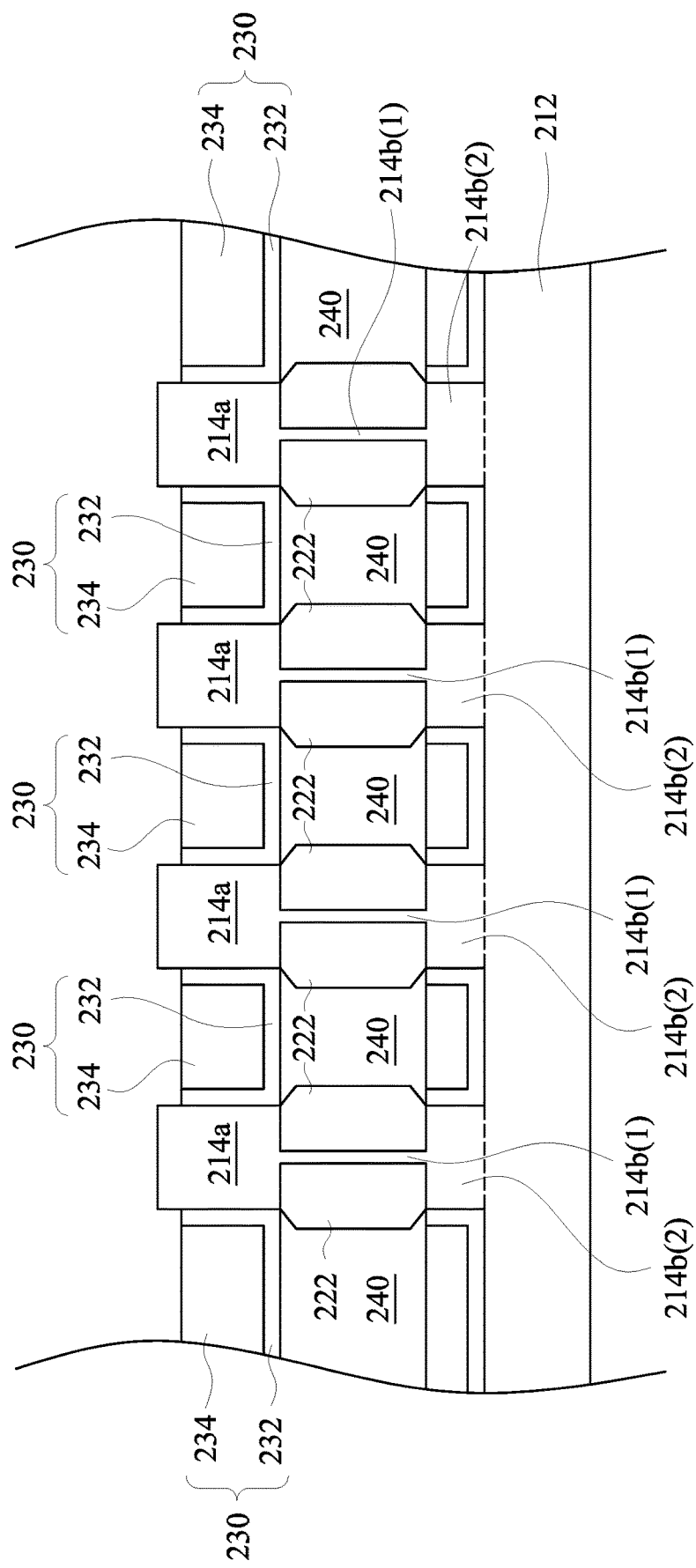
Figure 2S:
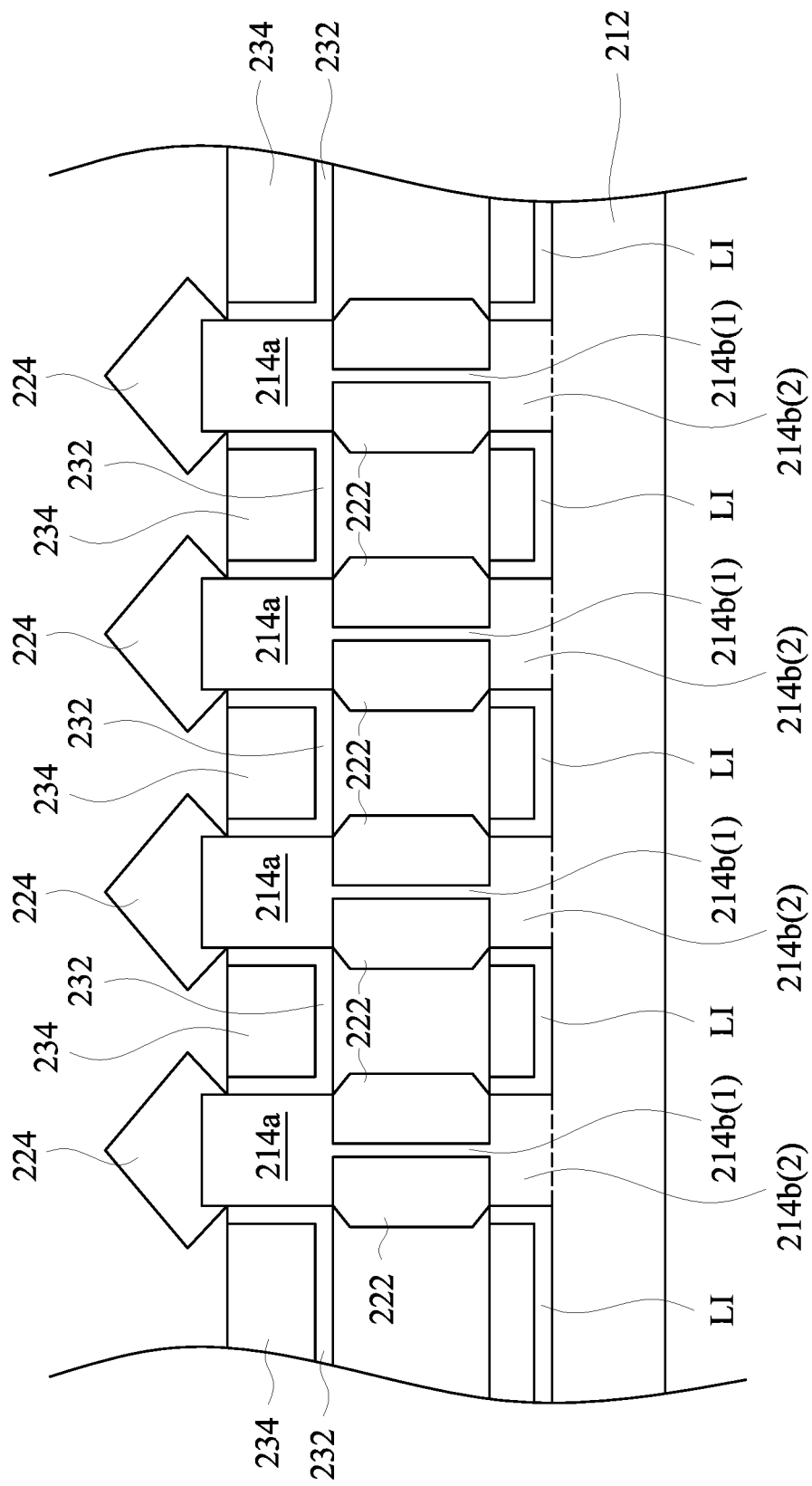
Figure 2T:
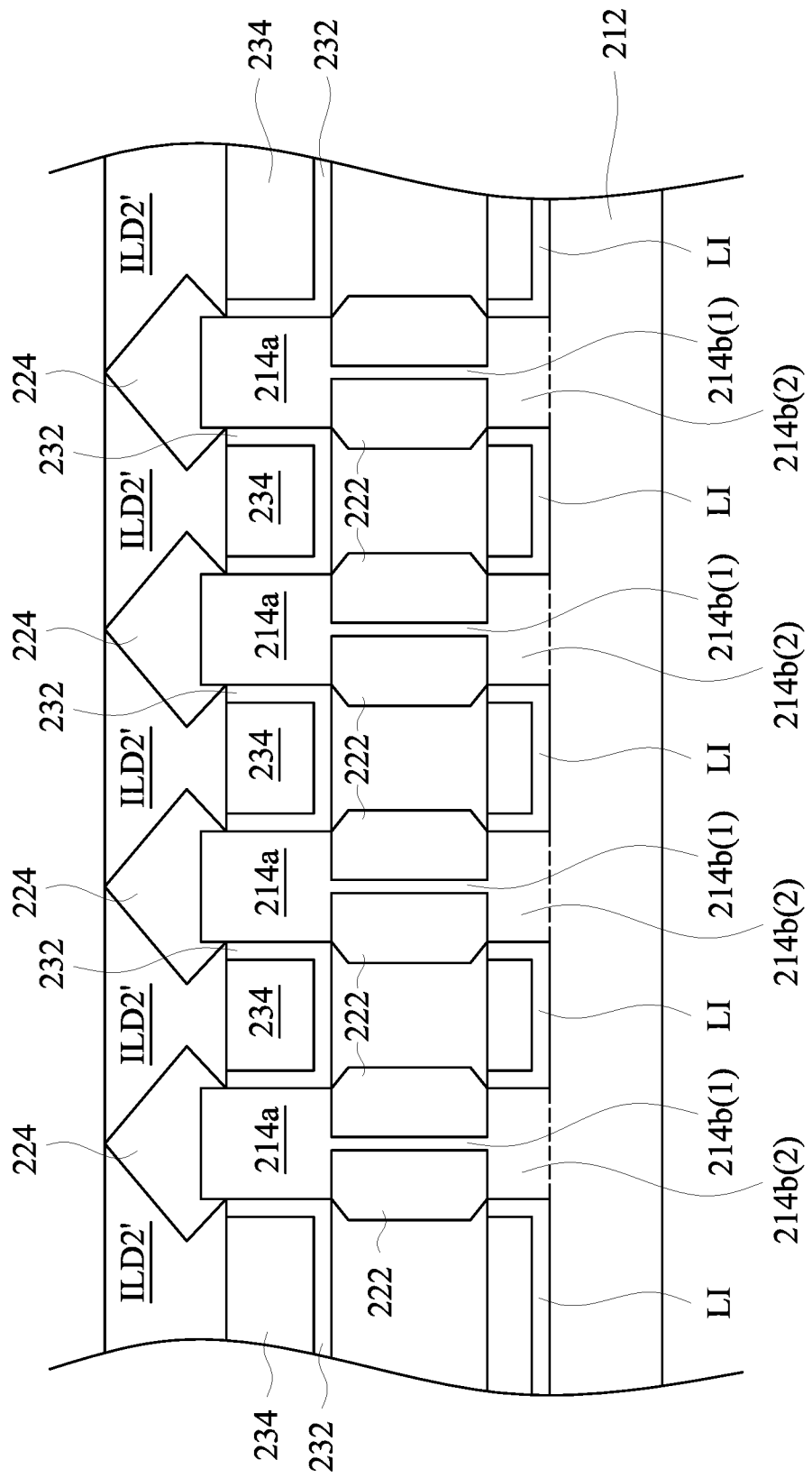

Referring to FIG. 2A to FIG. 2T, FIG. 2A to FIG. 2T are cross-sectional views of intermediate stages showing a method for fabricating a transistor device in accordance with some embodiments of the present disclosure. At first, a semiconductor substrate 210 is provided, as shown in FIG. 2A. In some embodiments, the semiconductor substrate 210 may be a semiconductor material and may include structures including a graded layer or a buried oxide, for example. In some exemplary examples, the semiconductor substrate 210 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 210. Alternatively, the semiconductor substrate 210 may be an active layer of a semiconductor-on-insulator (SOI) substrate or a multi-layered structure such as a silicon-germanium layer formed on a bulk silicon layer.

Then, plural mask layers HM are formed on the semiconductor substrate 210, as shown in FIG. 2B. In some embodiments, the mask layers HM are hard masks, and plural oxide layers OX maybe formed between the mask layers HM and the semiconductor substrate 210. However, embodiments of the present disclosure are not limited thereto. Further, the materials of the mask layers HM and the oxide layers OX can be blanketly deposited on the semiconductor substrate 210, and then etched to form the mask layers HM and the oxide layers OX as shown in FIG. 2B.

Therefore, the semiconductor substrate 210 is patterned by using the mask layers HM to form a bottom portion 212 and plural fin portions 214, as shown in FIG. 2C. In some embodiments, the fin portions 214 are formed perpendicular to the bottom portion 212. In some embodiments, a width WF of each of the fin portions 214 is ranged from about 5 nm to 25 nm, and a pitch PF between adjacent two of the fin portions 214 is ranged from about 10 nm to about 50 nm. However, embodiments of the present disclosure are not limited thereto.

Then, a liner LI is formed to cover the fin portions 214 and the mask layers HM, as shown in FIG. 2D. The liner LI is configured to protect surfaces of the fin portions 214. In some embodiments, the liner LI can be omitted. In some embodiments, the liner LI can be made by oxide or SiN, but embodiments of the present disclosure are not limited thereto.

Thereafter, gaps between the fin portions 214 are filled with dielectric layers ILD21, as shown in FIG. 2E. In some embodiments, the dielectric layers ILD21 are made by oxide. For example, the dielectric layers ILD21 can be made by silicon oxide, but embodiments of the present disclosure are not limited thereto.

Then, the dielectric layers ILD21 are etched to define upper portions 214a and lower portions 214b of the fin portions 214, as shown in FIG. 2F. An interface between the upper portion 214a and the lower portion 214b is defined by the height HD of the etched dielectric layers ILD21. In some embodiments, a portion of the liner LI covering the mask layers HM are also etched.

Thereafter, the liner LI is removed and a spacer film SPF is formed to cover the fin portions 214, the mask layers HM and the dielectric layers ILD21, as shown in FIG. 2G. The spacer film SPF is made by a material having selectivity to silicon or silicon oxide. In some embodiments, the spacer film SPF is made by SiN, SiCN, SiOCN or other suitable material.

Then, the spacer film SPF is patterned to form spacers SP on sidewalls of the fin portions 214, as shown in FIG. 2H. In some embodiments, portions of the spacer film SPF covering the mask layers HM and the dielectric layers ILD21 are removed.

Thereafter, the dielectric layers ILD21 are further etched to define heights HS of sources, as shown in FIG. 2I. In some embodiments, after being etched, the dielectric layers ILD21 remain on the bottom portion 212 of the semiconductor substrate 210.

Then, portions of the liner LI not covered by the dielectric layers ILD21 are removed to expose surfaces of the lower portions 214b of the fin portions 214, as shown in FIG. 2J.

Thereafter, each of the lower portions 214b of the fin portions 214 is patterned to have a narrow portion 214b(1) and a base portion 214b(2), as shown in FIG. 2K. In some embodiments, the lower portions 214b of the fin portions 214 are laterally etched to form the narrow portions 214b(1), and a width W21 of the narrow portion 214b(1) is smaller than the width of the upper portion 214a (substantially equal to the width WF of the fin portion 214). After the lower portions 214b are etched, surfaces UES2 of the upper portions 214a are exposed because the width W21 of the narrow portion 214b(1) is smaller than the width of the upper portion 214a. For example, the lower portion 214b has an interface portion contacting the narrow portion 214b(1), and the surfaces UES2 of the interface portion are exposed because the formation of the narrow portion 214b(1). In some embodiments, each of the lower portions 214b(1) has a uniform width, but embodiments of the present disclosure are not limited thereto. In some embodiments, each of the fin portions 214 may have various widths because of the patterning process, and the various widths of each of the fin portions 214 are small than the width of the upper portion 214a.

Then, plural sources 222 are formed on the narrow portions 214b(1) of the lower portions 214b, as shown in FIG. 2L. The sources 222 are formed by using an epitaxial growth process. Because the surfaces UES2 of the upper portions 214a are exposed, the sources 222 are also formed on the surfaces UES2 of the upper portions 214a, and thus the sources 222 contact the upper portions 214a. For example, two sources 222 contact one corresponding upper portion 214a. In some embodiments, the sources 222 are formed to cover the whole surfaces UES2.

Thereafter, gaps between the fin portions 214 are filled with dielectric layers ILD22, a shown in FIG. 2M. In some embodiments, the dielectric layers ILD22 are made by oxide. For example, the dielectric layers ILD22 can be made by silicon oxide, but embodiments of the present disclosure are not limited thereto. Because the dielectric layers ILD21 and ILD22 are made by the same material in this embodiment, the combination of the dielectric layers ILD21 and ILD22 are referred to as dielectric layers ILD2 hereinafter.

Then, the dielectric layers ILD2 are etched to expose the spacers SP, as shown in FIG. 2N. In some embodiments, the dielectric layers ILD2 are etched to be aligned interfaces between the upper portions 214a and the lower portions 214b of the fin portions 214, thereby exposing the whole spacers SP and protecting the sources 222.

Thereafter, the spacers SP and the mask layers HM are removed to expose the upper portions 214a of the fin portions 214, as shown in FIG. 2O.

Then, a gate dielectric layer 232 is formed to cover the dielectric layers ILD2, the upper portions 214a of the fin portions 214 and the oxide layers, as shown in FIG. 2P. In some embodiments, the gate dielectric layer 232 is a high-k dielectric layer. For example, the gate dielectric layer 232 may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material.

Thereafter, gate electrodes 234 are formed between the upper portions 214a of the fin portions 214, as shown in FIG. 2Q. In some embodiments, the gate electrodes 234 are formed on the gate dielectric layer 232 and contact the gate dielectric layer 232, but embodiments of the present disclosure are not limited thereto.

Then, the gate dielectric layer 232, the gate electrodes 234 and the oxide layers OX are etched to expose the ends of the upper portions 214a of the fin portions 214, as shown in FIG. 2R. In some embodiments, the gate electrodes 234 are etched back, thereby forming gate structures 230 on the upper portions 214a. In some embodiments, portions of the gate dielectric layer 232 located on the ends the upper portions 214a of the fin portions 214 are removed, and the oxide layers are also removed, thereby exposing the ends of the upper portions 214a of the fin portions 214.

Thereafter, plural drains 224 are formed on the ends of the upper portions 214a of the fin portions 214, as shown in FIG. 2S. In some embodiments, the drains 224 are formed by using an epitaxial growth process, and the drains 224 are not merged with each other.

Then, gaps between the drains 224 are filled with dielectric layers ILD2', as shown in FIG. 2T. In some embodiments, the dielectric layers ILD2' can be made by oxide, but embodiments of the present disclosure are not limited thereto.

In some embodiments, the positions of the drains 224 and the sources 222 can be exchanged. For example, the drains 224 can be disposed on the recesses CS2 of the lower portions 214b of the fin portions 214, and the sources 222 can be disposed on the ends of the upper portions 214a of the fin portions 214.

It can be understood that, because the gate structures 230 are formed on the upper portions 214a of the fin portions 214, and the sources 222 contact the upper portions 214a of the fin portions 214, a contact area between the sources 222 and the channels induced in the upper portions 214a, and a distance between the source 222 and the induced channel corresponding thereto is decreased accordingly.

Figure 3:
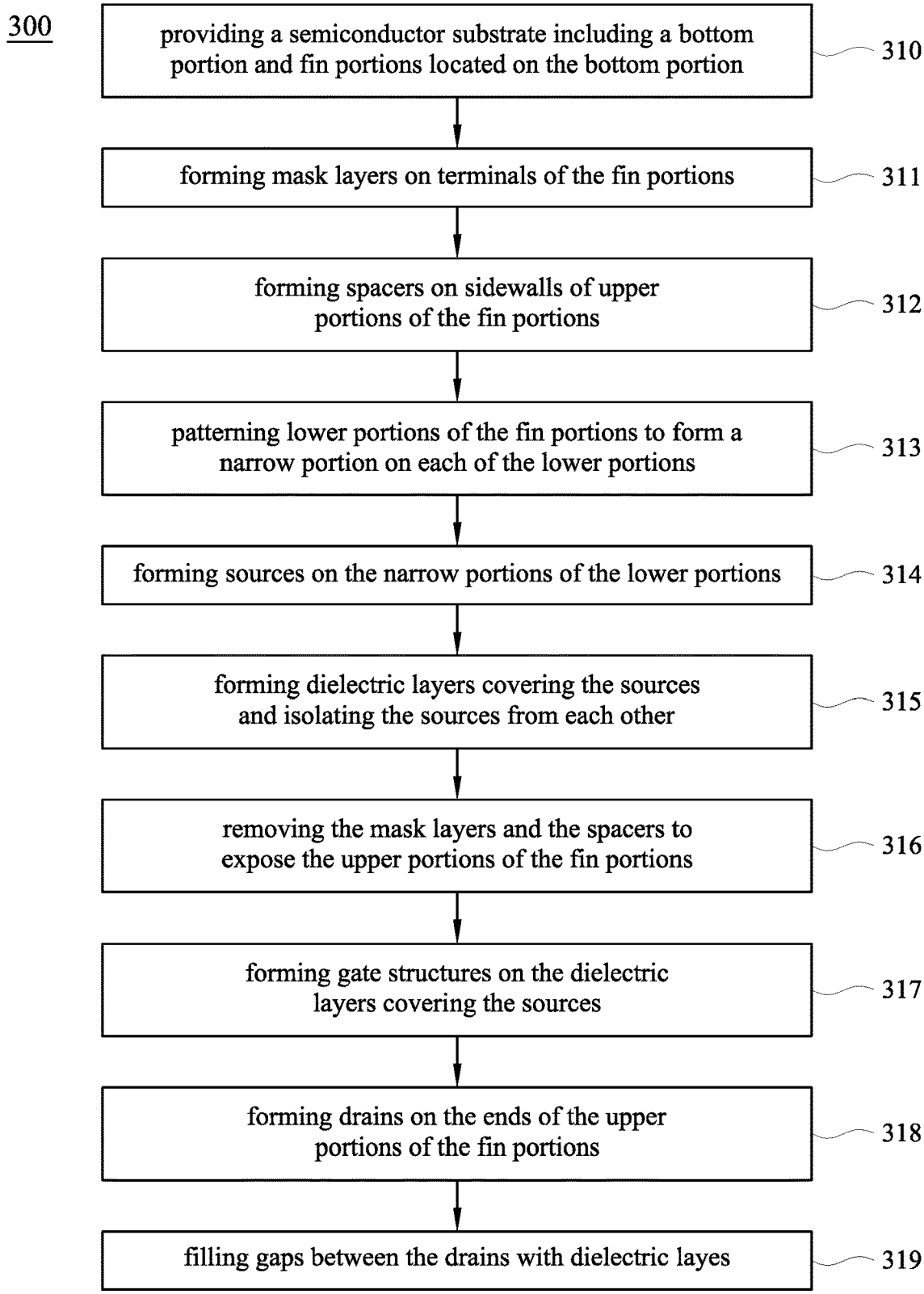
FIG. 3 is a flow chart showing a method for fabricating a transistor device in accordance with embodiments of the present disclosure.

Referring to FIG. 3, FIG. 3 is a flow chart showing a method 300 for fabricating a transistor device in accordance with embodiments of the present disclosure. The method 300 begins at operation 310. In operation 310, the semiconductor substrate 210 is provided as shown in FIG. 2A and FIG. 2B. For example, the semiconductor substrate 210 shown in FIG. 2A is provided at first, and then the semiconductor substrate 210 are patterned to include the bottom portion 212 and the fin portions 214 as shown in FIG. 2B. In some embodiments, the semiconductor substrate 210 can be patterned by using an etching process, but embodiments of the present disclosure are not limited thereto.

Then, in operation 311, the mask layers HM are formed on the ends of the fin portions 214, as shown in FIG. 2C. In some embodiments, the oxide layers OX are formed between the mask layers HM and the ends of the fin portions 214. However, embodiments of the present disclosure are not limited thereto. In some embodiments, the oxide layers OX can be omitted.

In some embodiments, the liner LI can be optionally formed on the fin portions 214 and the mask layers HM, as shown in FIG. 2D, FIG. 2E and FIG. 2F. For example, after the mask layers HM are formed on the fin portions 214, the liner LI is formed to cover the fin portions 214 and the mask layers HM, as shown in FIG. 2E. Then, gaps between the fin portions 214 are filled with the dielectric layers ILD21, and the dielectric layers ILD21 and a portion of the liner LI covering the mask layers HM are etched, as shown in FIG. 2E and FIG. 2F. In some embodiments, the liner LI can be formed by using a deposition process such as an atomic layer deposition (ALD). Other methods to form the dielectric layers ILD22 include chemical vapor deposition (CVD), physical vapor deposition (PVD), and plasma enhanced chemical vapor deposition (PECVD). In some embodiments, the liner LI can be omitted.

Thereafter, in operation 312, the spacers SP are formed on sidewalls of the upper portions 214a of the fin portions 214, as shown in FIG. 2G and FIG. 2H. For example, after removing the liner LI, the spacer film SPF is formed to cover the fin portions 214 as shown in FIG. 2G. Then, the spacer film SPF is patterned to form the spacers SP on the sidewalls of the fin portions 214, as shown in FIG. 2H. In some embodiments, the spacer film SPF is patterned by using an etching process, but embodiments of the present disclosure are not limited thereto.

Thereafter, in operation 313, the lower portions 214b of the fin portions 214 are patterned to form the narrow portion 214b(1) on each of the lower portions 214b of the fin portions 214, as shown in FIG. 2I, FIG. 2J and FIG. 2K. For example, the dielectric layers ILD21 and the portions of the liner LI not covered by the dielectric layers ILD21 are removed to expose surfaces of the lower portions 214b of the fin portions 214, as shown in FIG. 2I and FIG. 2J. Then, the exposed surfaces of the lower portions 214b of the fin portions 214 are patterned to form the narrow portion 214b(1), as shown in FIG. 2K.

Then, in operation 314, the sources 222 are formed on narrow portions of the lower portions 214b, as shown in FIG. 2L. The sources 222 are formed by using an epitaxial growth process. Because the surfaces UES2 of the upper portions 214a are exposed, the sources 222 are also formed on the surfaces UES2 of the upper portions 214a, and thus the sources 222 contact the upper portions 214a.

Thereafter, in operation 315, the dielectric layers ILD22 are formed to cover the sources 222 and isolate the sources 222 from each other, as shown in FIG. 2M and FIG. 2N. For example, the gaps between the fin portions 214 are filled with dielectric layers ILD22, a shown in FIG. 2M. Then, the dielectric layers ILD22 are etched to expose the spacers SP, as shown in FIG. 2N. In some embodiments, the dielectric layers ILD22 are formed by using a deposition process such as an atomic layer deposition (ALD). Other methods to form the dielectric layers ILD22 include chemical vapor deposition (CVD), physical vapor deposition (PVD), and plasma enhanced chemical vapor deposition (PECVD).

Then, in operation 316, the mask layers HM and the spacers SP are removed to expose the upper portions 214a of the fin portions 214, as shown in FIG. 2O.

Thereafter, in operation 317, plural gate structures 230 are formed on the dielectric layers ILD2, in which the gate structures 230 and the upper portions 214a of the fin portions 214 are alternately arranged with each other, as shown in FIG. 2P, FIG. 2Q and FIG. 2R. For example, at first, the gate dielectric layer 232 is formed to cover the dielectric layers ILD2, the upper portions 214a of the fin portions 214 and the oxide layers, as shown in FIG. 2P. Then, the gate electrodes 234 are formed on the gate dielectric layer 232 and between the upper portions 214a of the fin portions 214, as shown in FIG. 2Q. Thereafter, the gate dielectric layer 232, the gate electrodes 234 and the oxide layers OX are etched to expose the ends of the upper portions 214a of the fin portions 214, as shown in FIG. 2R.

In some embodiments, the gate dielectric layer 232 and the gate electrodes 234 can be formed by using a deposition process such as an atomic layer deposition (ALD). Other methods to form the dielectric layers ILD22 include chemical vapor deposition (CVD), physical vapor deposition (PVD), and plasma enhanced chemical vapor deposition (PECVD).

Then, in operation 318, the drains 224 are formed on the ends of the upper portion 214a of the fin portions 214, as shown in FIG. 2S. In some embodiments, the drains 224 are formed by using an epitaxial growth process, and the drains 224 are not merged with each other.

Thereafter, in operation 319, the gaps between the drains 224 are filled with the dielectric layers ILD2', as shown in FIG. 2T. In some embodiments, the dielectric layers ILD2' can be formed by using a deposition process such as an atomic layer deposition (ALD). Other methods to form the dielectric layers ILD22 include chemical vapor deposition (CVD), physical vapor deposition (PVD), and plasma enhanced chemical vapor deposition (PECVD).

In accordance with an embodiment of the present disclosure, the present disclosure discloses a semiconductor device. The semiconductor device includes a semiconductor substrate and sources/drains. The semiconductor substrate includes a bottom portion and a fin portion. The fin portion is located on the bottom portion, in which the fin portion includes an upper portion and a lower portion located between the bottom portion of the semiconductor substrate and the upper portion of the fin portion. The lower portion includes a narrow portion having a width smaller than a width of the upper portion, and the narrow portion contacts an interface portion of the upper portion. The sources/drains are disposed on the on the narrow portions of the lower portion of the fin portion, in which each of the sources/drains has an edge portion contacting the interface portion of the upper portion of the fin portion.

In accordance with another embodiment of the present disclosure, the present disclosure discloses a semiconductor device. The semiconductor device includes a semiconductor substrate, first sources/drains and second sources/drains. The semiconductor substrate includes a bottom portion and fin portions located on the bottom portion. Each of the fin portions includes an upper portion and a lower portion located between the bottom portion of the semiconductor substrate and the upper portion, in which the lower portion includes a narrow portion having a width smaller than a width of the upper portion, and the lower portion contacts an interface portion of the upper portion. The first sources/drains are disposed on the upper portions of the fin portions. The second sources/drains are disposed on the narrow portions of the lower portions of the fin portions, in which the second sources/drains are not merged with each other, and two of the second sources/drains contact the interface portion of the upper portion of one of the fin portions.

In accordance with another embodiment of the present disclosure, a method for fabricating a semiconductor device is disclosed. In the method for fabricating a semiconductor device, at first, a semiconductor substrate is provided, in which the semiconductor substrate includes a bottom portion and fin portions located on the bottom portion. Then, mask layers are formed on ends of the fin portions. Thereafter, spacers are formed on sidewalls of upper portions of the fin portions. Thereafter, lower portions of the fin portions are patterned to form a narrow portion on each of the lower portions, in which a width of the narrow portion is smaller than a width of each of the upper portions, and the narrow portion of each of the lower portions contacts an interface portion of a corresponding upper portion. Then, sources are formed on the narrow portions of the lower portions of the fin portions, in which each of the sources formed on the narrow portion of each of the lower portions contacts the interface portion of the corresponding upper portion of the fin portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
a fin portion over the substrate, wherein the fin portion comprises:
a lower portion and an upper portion over the substrate, wherein the lower portion is close to the substrate and the upper portion is away from the substrate; and
a middle portion between a bottommost surface of the upper portion and a topmost surface of the lower portion, wherein the middle portion has a width smaller than a width of the upper portion;
a first source/drain laterally surrounding the middle portion of the fin portion and vertically between the bottommost surface of the upper portion and the topmost surface of the lower portion; and
a second source/drain in contact with sidewalls and a topmost surface of the upper portion of the fin portion.

2. The semiconductor device of claim 1, further comprising a gate structure laterally surrounding the upper portion of the fin portion to induce a channel in the upper portion of the fin portion.

3. The semiconductor device of claim 1, further comprising a silicide layer disposed on the first sources/drain.

4. The semiconductor device of claim 1, wherein the middle portion of the fin portion has a uniform width.

5. The semiconductor device of claim 1, further comprising a gate structure laterally surrounding the upper portion of the fin portion and having a topmost surface lower than the topmost surface of the upper portion.

6. The semiconductor device of claim 1, wherein the first source/drain has a greater height than the second source/drain, and the height is measured in a direction perpendicular to the substrate.

7. A semiconductor device, comprising:
a semiconductor substrate comprising:
a bottom portion; and
a plurality of fin portions located on the bottom portion, wherein each of the fin portions comprises:
an upper portion; and
a lower portion located between the bottom portion of the semiconductor substrate and the upper portion, wherein the lower portion comprises a narrow portion having a width smaller than a width of the upper portion; and
a plurality of first sources/drains disposed on the upper portions of the fin portions;
a plurality of second sources/drains disposed on the narrow portions of the lower portions of the fin portions, wherein the second sources/drains are not merged with each other, and at least one of the second sources/drains is in direct contact with a bottom surface of the upper portion of one of the fin portions.

8. The semiconductor device of claim 7, further comprising a plurality of gate structures disposed on the upper portions of the fin portions to induce a plurality of channels in the upper portions of the fin portions.

9. The semiconductor device of claim 7, wherein the two of the second sources/drains fully cover the interface portion of the upper portion of the one of the fin portions.

10. The semiconductor device of claim 7, wherein two second sources/drains of two adjacent fin portions have respective front surfaces opposite to each other, and each of the two second sources/drain has a silicide layer covering its front surface.

11. The semiconductor device of claim 10, further comprising a contact located on the silicide layer.

12. The semiconductor device of claim 7, wherein the narrow portion of the lower portion of each of the fin portions has a uniform width.

13. A semiconductor device comprising:
a fin portion above a substrate, wherein the fin portion comprises:
upper and lower portions that have a first width, wherein the lower portion is close to the substrate and the upper portion is away from the substrate; and
a middle portion extending from a topmost surface of the lower portion to a bottommost surface of the upper portion, wherein the middle portion has a second width smaller than the first width;

a gate structure laterally surrounding the upper portion of the fin portion, wherein a topmost surface of the upper portion is higher than a topmost surface of the gate structure;

a first source/drain laterally surrounding the middle portion of the fin portion and vertically between the topmost surface of the lower portion and the bottommost surface of the upper portion; and a second source/drain wrapping around at least three sides of the upper portion of the fin portion.

14. The semiconductor device of claim 13, wherein the bottommost surface of the upper portion is in contact with a topmost surface of the first source/drain.

15. The semiconductor device of claim 13, further comprising a dielectric layer laterally surrounding the first source/drain, wherein a bottom surface of the gate structure is in contact with the dielectric layer.

16. The semiconductor device of claim 13, further comprising a dielectric layer laterally surrounding the first source/drain, wherein the gate structure includes a gate dielectric layer in contact with the dielectric layer.

17. The semiconductor device of claim 13, wherein the topmost surface of the lower portion is in contact with a bottommost surface of the first source/drain.

18. The semiconductor device of claim 13, further comprising a liner laterally surrounding the lower portion of the fin portion.

19. The semiconductor device of claim 13, further comprising a dielectric layer laterally surrounding the second source/drain and having a bottommost surface in contact with the gate structure.

20. The semiconductor device of claim 13, wherein the second source/drain has a different cross-sectional shape than the first source/drain.

* * * * *